(12) United States Patent
Lee

(10) Patent No.: US 12,713,616 B2
(45) Date of Patent: Aug. 18, 2026

(54) THREE-DIMENSIONAL FERROELECTRIC MEMORY DEVICE

(71) Applicant: SK hynix Inc., Icheon-si (KR)

(72) Inventor: Woo Cheol Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 512 days.

(21) Appl. No.: 18/330,392

(22) Filed: Jun. 7, 2023

(65) Prior Publication Data

US 2024/0224534 A1 Jul. 4, 2024

(30) Foreign Application Priority Data

Dec. 29, 2022 (KR) ........................ 10-2022-0189492

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC ......... H10B 51/20; H10B 51/30; H10B 51/10
See application file for complete search history.

(56) References Cited

U.S. PATENT DOCUMENTS 11,133,329 B2 9/2021 Lue
11,232,838 B2 1/2022 Lu
2021/0399013 A1* 12/2021 Wu ........................ H10B 51/10
2022/0130862 A1* 4/2022 Lue ........................ H10B 41/10

* cited by examiner

*Primary Examiner* — Tucker J Wright

(57) ABSTRACT

A ferroelectric memory device includes a substrate, a gate structure disposed over the substrate. The gate structure includes a plurality of gate electrode layers spaced apart from each other along a first direction substantially perpendicular to a surface of the substrate. The ferroelectric memory device includes a first electrode pillar and a second electrode pillar that extend along the first direction and are disposed to be spaced apart from each other in a second direction substantially parallel to the surface of the substrate inside a hole penetrating the gate structure, and a device isolation structure disposed to cross the first and second electrode pillars and to separate the gate structure over the substrate. The gate structure further includes a plurality of ferroelectric layers and a plurality of channel layers which are disposed to correspond to the plurality of gate electrode layers.

20 Claims, 36 Drawing Sheets

THREE-DIMENSIONAL FERROELECTRIC MEMORY DEVICE

CROSS-REFERENCE TO RELATED APPLICATIONS

The present application claims priority under 35 U.S.C. § 119(a) to Korean Application No. 10-2022-0189492, filed on Dec. 29, 2022 in the Korean Intellectual Property Office, which is incorporated herein by reference in its entirety.

BACKGROUND

1. Technical Field

The present disclosure generally relates to memory devices and, more particularly, to three-dimensional ferroelectric memory devices.

2. Related Art

As design rules decrease and integration levels increase, research into nonvolatile memory devices having three-dimensional structures continues. Currently, NAND flash memory devices with three-layered stack structures including a charge tunneling layer, a charge trap layer, and a charge barrier layer are widely used in charge storage methods.

Recently, a nonvolatile memory device employing an operation method other than a charge storage method has appeared. As an example of a volatile memory device in such an operation method, a ferroelectric memory device employs a ferroelectric layer as a gate dielectric layer of a transistor. The ferroelectric memory device may non-volatilely store a remanent polarization having different magnitudes and orientations as signal information in a ferroelectric layer. In addition, the signal information may be read out using a characteristic in which a magnitude of an operation current flowing through a channel layer between source and drain electrodes changes according to the stored remanent polarization. The ferroelectric memory device may be easily stacked in three dimensions, so that the ferroelectric memory device may contribute to improving the degree of integration of memory cells.

SUMMARY

A ferroelectric memory device according to an aspect of the present disclosure may include a substrate, and a gate structure disposed over the substrate. The gate structure may include a plurality of gate electrode layers spaced apart from each other along a first direction that is substantially perpendicular to a surface of the substrate. The ferroelectric memory device may include a first electrode pillar and a second electrode pillar that extend along the first direction and are spaced apart from each other in a second direction substantially parallel to the surface of the substrate inside a hole penetrating the gate structure, and a device isolation structure disposed to cross the first and second electrode pillars and to separate the gate structure over the substrate. The gate structure may further include a plurality of ferroelectric layers and a plurality of channel layers that are disposed to correspond to the plurality of gate electrode layers.

A ferroelectric memory device according to another aspect of the present disclosure may include a substrate, a gate structure disposed over the substrate, a plurality of holes penetrating the gate structure over the substrate and first and second electrode pillars disposed to extend along the first direction inside the plurality of holes, and a device isolation structure disposed to cross the plurality of holes over the substrate and to extend along a second direction substantially parallel to the surface of the substrate. The gate structure may include a plurality of gate electrode layers spaced apart from each other along a first direction that is substantially perpendicular to a surface of the substrate. The gate structure may further include a plurality of ferroelectric layers and a plurality of channel layers which are disposed to correspond the plurality of gate electrode layers. The first and second electrode pillars may be disposed to be electrically connected to the plurality of channel layers.

BRIEF DESCRIPTION OF THE DRAWINGS

FIGS. 13A to 22A are plan views schematically illustrating a method of manufacturing a ferroelectric memory device according to an embodiment of the present disclosure.

FIGS. 13B to 22B, 21C and 22C are cross-sectional views schematically illustrating a method of manufacturing a ferroelectric memory device according to an embodiment of the present disclosure.

DETAILED DESCRIPTION

Figure 1:
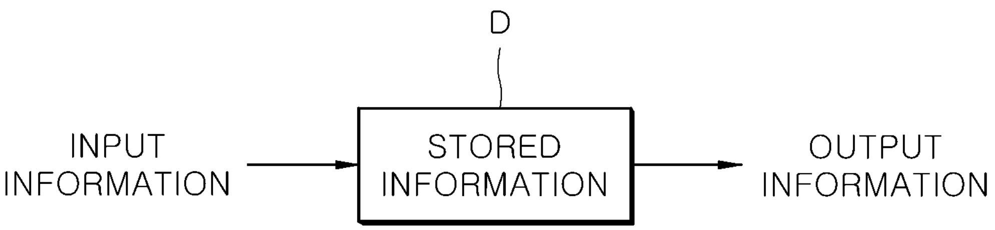
FIG. 1 schematically illustrates an operation of a unit ternary content addressable memory (TCAM) cell according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

The coordinate system including an a-axis, b-axis, and c-axis and the coordinate system including an x-axis, y-axis, and z-axis described in the specification of the present application may be, for example, a Cartesian coordinate system.

In an embodiment of the present disclosure, there is provided a ferroelectric memory device. The ferroelectric memory device may be implemented in a form of a field effect transistor employing a ferroelectric layer as a gate dielectric layer. The ferroelectric memory device may non-volatilely store at least two remanent polarizations distinguished from each other in the ferroelectric layer, and may use a characteristic in which a threshold voltage of the field effect transistor changes according to the stored polarizations for signal storage and reading of the stored signal. The ferroelectric memory device may include ferroelectric memory cells that are three-dimensionally stacked over a substrate.

The three-dimensional ferroelectric memory device may be applied in, for example, a ternary content addressable memory (TCAM) device. As will be described below, a unit TCAM cell including a pair of ferroelectric memory cells may improve cell integration of the TCAM device.

The TCAM device may be a memory device designed to store 'X' (don't care) as information in addition to '0' and '1'. In addition, when search data (e.g., referred to as 'input word') is input to the TCAM device, the TCAM device may output an address of data stored in the TCAM, which matches the search data through an internal arithmetic operation. Meanwhile, an operation method of the TCAM device may be different from that of a conventional random access memory (RAM) device, in which a memory device outputs data stored at a predetermined address when the predetermined address is input to the memory device.

FIG. 1 schematically illustrates an operation of a unit TCAM cell according to an embodiment of the present disclosure. Referring to FIG. 1, a unit TCAM cell D may be a cell of a memory device, and may store information of '0', '1', or 'X'. In addition, as shown in Table 1, the unit TCAM cell D may generate output information by comparing input information with stored information as follows.

TABLE 1

| Input information | Stored information | Output information |
|---|---|---|
| 0 | 0 | 1 |
| 0 | 1 | 0 |
| 1 | 0 | 0 |
| 1 | 1 | 1 |
| X | 0 or 1 or X | 1 |
| 0 or 1 or X | X | 1 |

Referring to [Table 1], the generation of '1' as the output information may mean that the input information and the stored information match or are identical to each other. On the other hand, the generation of '0' as the output information may mean that the input information and the stored information do not match or are not identical each other. However, when the input information or the stored information is 'X', the unit TCAM cell D may always generate '1' corresponding to matching or identical as the output information.

Figure 2:
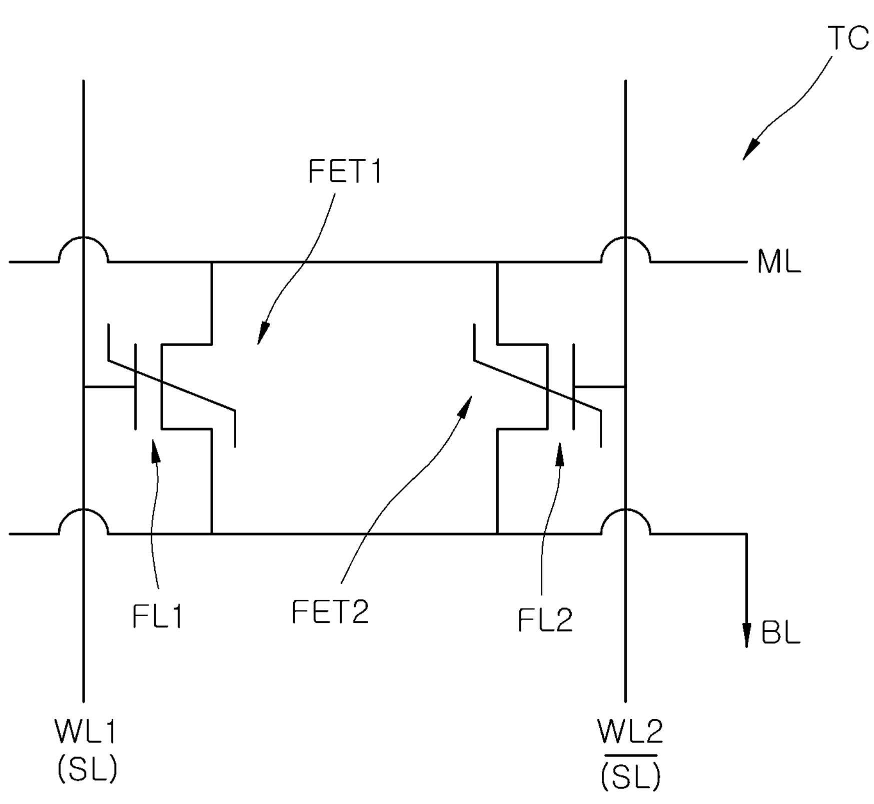
FIG. 2 is a circuit diagram schematically illustrating a unit TCAM cell according to an embodiment of the present disclosure.

FIG. 2 is a circuit diagram schematically illustrating a unit TCAM cell according to an embodiment of the present disclosure. Referring to FIG. 2, a unit TCAM cell TC may include first and second ferroelectric field effect transistors FET1 and FET2 corresponding to a pair of ferroelectric memory cells.

In the unit TCAM cell TC, one of source and drain of each of the first and second ferroelectric field effect transistors FET1 and FET2 may be electrically connected to a matching line ML. The other of the source and drain of each of the first and second ferroelectric field effect transistors FET1 and FET2 may be electrically connected to a bit line BL. That is, the first and second ferroelectric field effect transistors FET1 and FET2 may share the matching line ML and the bit line BL with each other.

A gate electrode of the first ferroelectric field effect transistor FET1 and a gate electrode of the second ferroelectric field effect transistor FET2 may be electrically connected to a first word line WL1 and a second word line WL2, respectively. The first and second word lines WL1 and WL2 may independently apply gate voltages to the gate electrodes of the first and second ferroelectric field effect transistors FET1 and FET2, respectively. In an embodiment, by a first gate voltage applied through the first word line WL1, a polarization signal may be written in a first ferroelectric gate insulation layer FL1 of the first ferroelectric field effect transistor FET1. Likewise, by a second gate voltage applied through the second word line WL2, a polarization signal may be written in a second ferroelectric gate insulation layer FL2 of the second ferroelectric field effect transistor FET2. In an embodiment, depending on the magnitudes and polarities of the first and second gate voltages, the polarization signal stored in the first ferroelectric gate insulation layer FL1 and the polarization signal stored in the second ferroelectric gate insulation layer FL2 may be the same as or different from each other.

In an embodiment, the stored information '0' of the unit TCAM cell TC may mean that polarization signal '0' is written in the first ferroelectric gate insulation layer FL1 and polarization signal '1' is written in the second ferroelectric gate insulation layer FL2. In addition, the stored information '1' of the unit TCAM cell TC may mean that polarization signal '1' is written in the first ferroelectric gate insulation layer FL1 and polarization signal '0' is written in the second ferroelectric gate insulation layer FL2. In an embodiment, the stored information 'X' of the unit TCAM cell TC may mean that polarization signal '1' is written in the first ferroelectric gate insulation layer FL1 and polarization signal '1' is written in the second ferroelectric gate insulation layer FL2.

In an embodiment, the polarization signal '0' may mean that a corresponding ferroelectric field effect transistor between the first and second ferroelectric field effect transistors FET1 and FET2 has a first threshold voltage Vth1 through the write operation. The polarization signal '1' may mean that a corresponding ferroelectric field effect transistor between the first and second ferroelectric field effect transistors FET1 and FET2 has a second threshold voltage Vth2 that is greater than the first threshold voltage Vth1 through the write operation. Each of the first and second ferroelectric field effect transistors FET1 and FET2 may have one of the first and second threshold voltages Vth1 and Vth2. Both the first and second threshold voltages Vth1 and Vth2 may have positive values.

In an embodiment, a search operation of the unit TCAM cell TC may proceed as follows. In order to search for the search information '0' for the unit TCAM cell TC, a search signal '0' may be applied through a first search line SL (i.e., the first word line WL1), and a search signal '1' may be applied through a second search line /SL (i.e., the second word line WL2). In addition, in order to search for the search information '1' for the unit TCAM cell TC, a search signal '1' may be applied through the first search line SL (i.e., the first word line WL1), and a search signal '0' may be applied through the second search line /SL (i.e., the second word line WL2). In addition, in order to search for the search information 'X' for the unit TCAM cell TC, a search signal '0' may be applied through the first search line SL (i.e., the first word line WL1), and a search signal '0' may be applied through the second search line /SL (i.e., the second word line WL2).

In an embodiment, while the search operation is in progress, a reference voltage Vm may be applied to the matching line ML, and the bit line BL may be grounded. Applying the search signal '0' to a selected search line between the first and second search lines SL and /SL may mean applying 0 V to the selected search line. Inputting the search signal '1' to the selected search line between the first and second search lines SL and /SL may mean applying a voltage Vr that is greater than the first threshold voltage Vth1 and less than the second threshold voltage Vth2 to the selected search line.

When the search signal '0' is input to the selected search line between the first and second search lines SL and /SL, the ferroelectric field effect transistor connected to the selected search line may maintain a turned-off state regardless of the polarization signal written in the ferroelectric gate insulation layer. When the search signal '1' is input to the selected search line between the first and second search lines SL and /SL, the ferroelectric field effect transistor connected to the selected search line may be turned on when the polarization signal '0' is stored, and may maintain the turned-off state when the polarization signal '1' is stored.

When the ferroelectric field effect transistor is turned-on, a conduction channel electrically connecting the matching line ML and the bit line BL may be formed in the ferroelectric field effect transistor, so that the reference voltage Vm of the matching line ML may drop. Because the first and second ferroelectric field effect transistors FET1 and FET2 of the unit TCAM cell TC share the matching line ML and the bit line BL, when at least one of the first and second ferroelectric field effect transistors FET1 and FET2 is turned on, the reference voltage Vm of the matching line ML may drop.

In an embodiment, when the reference voltage Vm drops during the search operation of the unit TCAM cell TC, the unit TCAM cell TC may output mismatch information "0" as a search result. When the reference voltage Vm is maintained during the search operation, the unit TCAM cell TC may output match information "1" as the search result.

Through the operation of the unit TCAM cell TC according to the circuit diagram of FIG. 2 as described above, output information that is substantially the same as the output information of the unit TCAM cell D of FIG. 1 described above with reference to [Table 1] may be derived.

Figure 3:
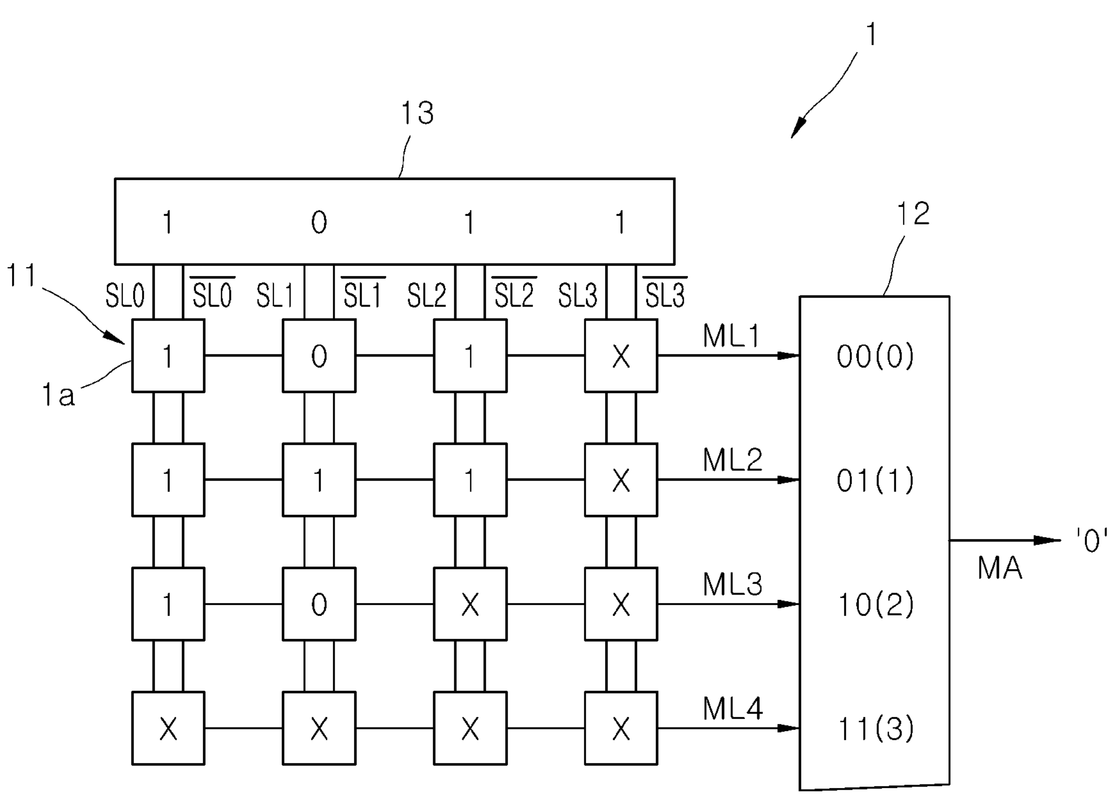
FIG. 3 is a view schematically illustrating a TCAM device including an array of unit TCAM cells according to an embodiment of the present disclosure.

FIG. 3 is a view schematically illustrating a TCAM device including an array of unit TCAM cells according to an embodiment of the present disclosure. Referring to FIG. 3, a TCAM device 1 may include a cell array 11 of a plurality of unit TCAM cells 1*a* configured in a 4×4 array. Each of the plurality of unit TCAM cells 1*a* may store information of '0', '1' or 'X'. In addition, the TCAM device 1 may include a priority encoder 12 that converts information output from the TCAM array 11 into an address and outputs the address.

Referring to FIG. 3, when search data 13 may be input to the TCAM array 11 through search lines SL0, /SL0, SL1, /SL1, SL2, /SL2, SL3, and /SL3, the search data 13 may be compared with information stored in the plurality of unit TCAM cells 1*a*, and a matching result may be output as signal information through matching lines ML1, ML2, ML3, and ML4. The priority encoder 12 may output a matching address MA, based on the matching result.

As an embodiment, when '1011' is input to the cell array 11 as the search data 13, a matching signal may be output from a matching line connected to the four contiguous unit TCAM cells 1*a* having the stored information that is matched for or identical to '1011'. Conversely, a mismatching signal may be output from a matching line connected to the four contiguous unit TCAM cells 1*a* having stored information that is not matched for or not identical to '1011'.

Referring to FIG. 3, the matching signal may be output from the first matching line ML1, the third matching line ML3, and the fourth matching line ML4, and the mismatching signal may be output from the second matching line ML2. The output matching signal may be input to the priority encoder 12. The priority encoder 12 may output priority address '0' as the matching address MA, among the address '0' corresponding to the matching signal of the first matching line ML1, the address '1' corresponding to the matching signal of the second matching line ML2, and the address '3' corresponding to the matching signal of the fourth matching line ML4.

Hereinafter, a three-dimensional ferroelectric memory device according to an embodiment of the present disclosure will be described in more detail. In an embodiment, the ferroelectric memory device may implement unit TCAM cells and a cell array including a plurality of unit TCAM cells in a three-dimensional structure over a substrate.

Figure 4:
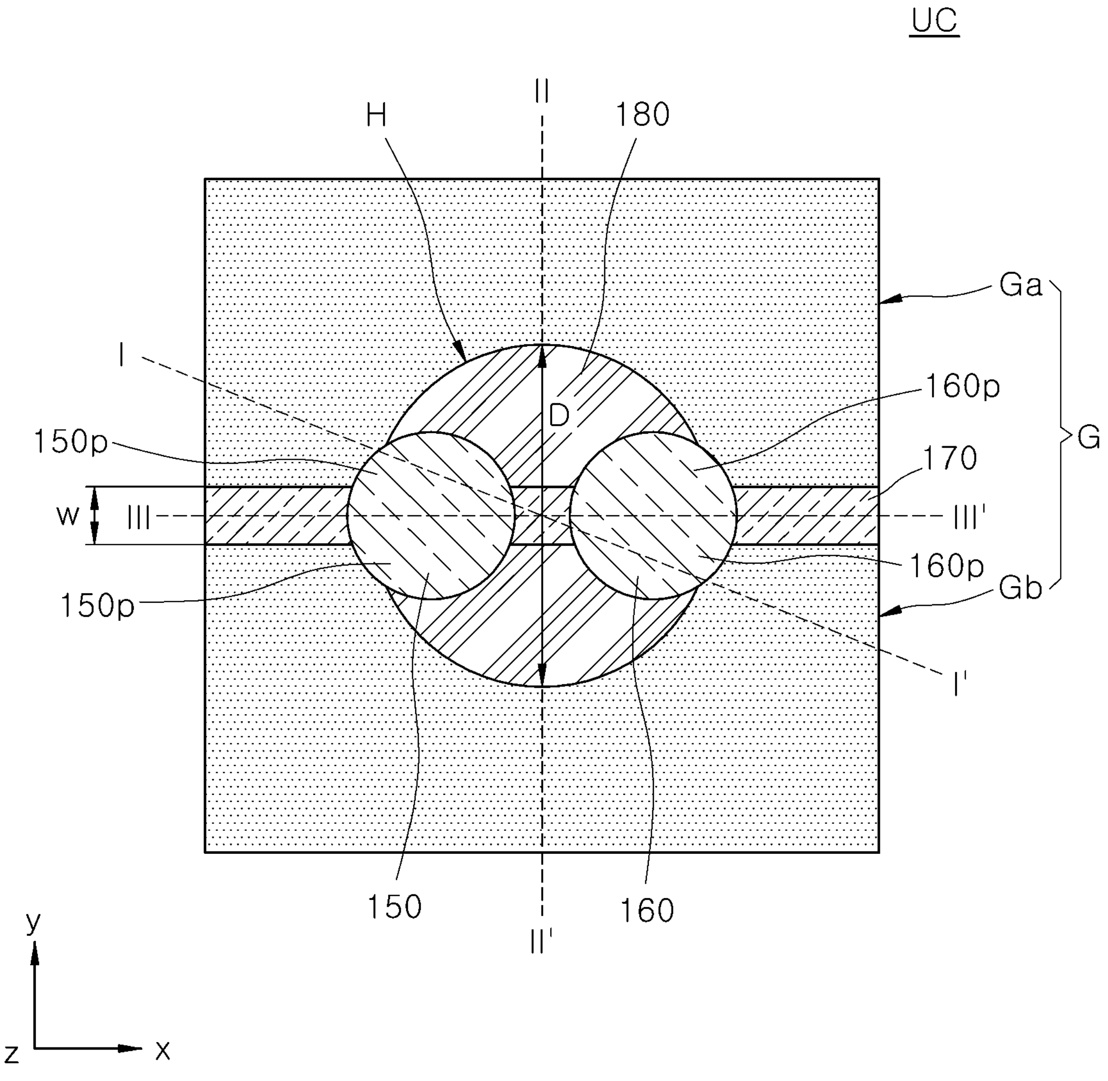
FIG. 4 is a plan view schematically illustrating a three-dimensional ferroelectric memory device according to an embodiment of the present disclosure.
Figure 5:
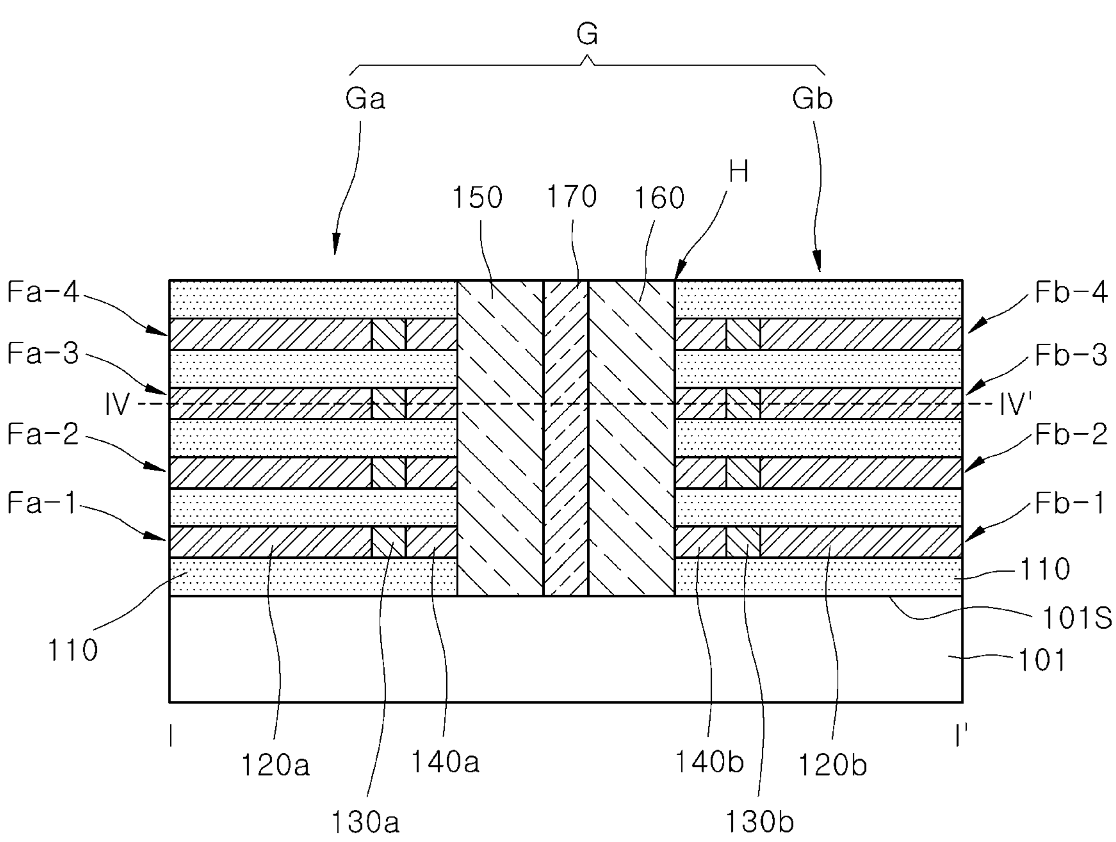
FIG. 5 is a cross-sectional view of the ferroelectric memory device of FIG. 4 taken along line I-I'.
Figure 6:
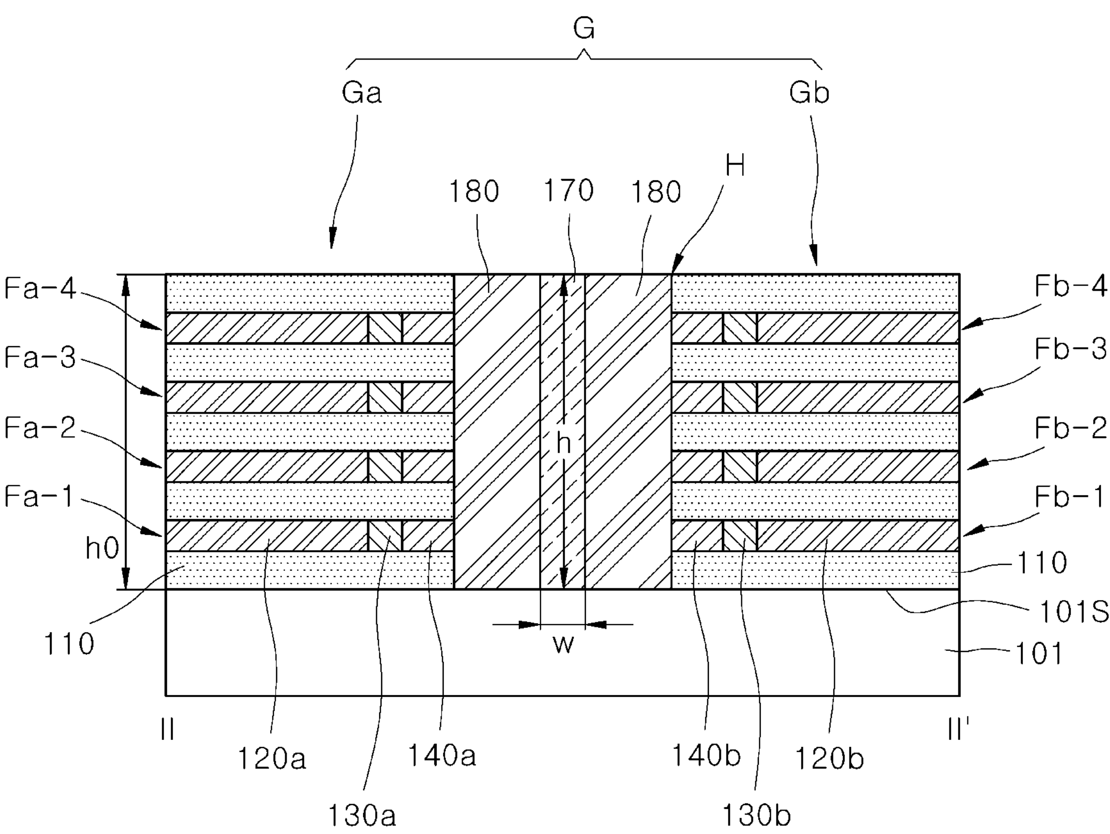
FIG. 6 is a cross-sectional view of the ferroelectric memory device of FIG. 4 taken along line II-II'.
Figure 6:
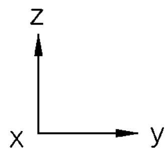
Figure 7:
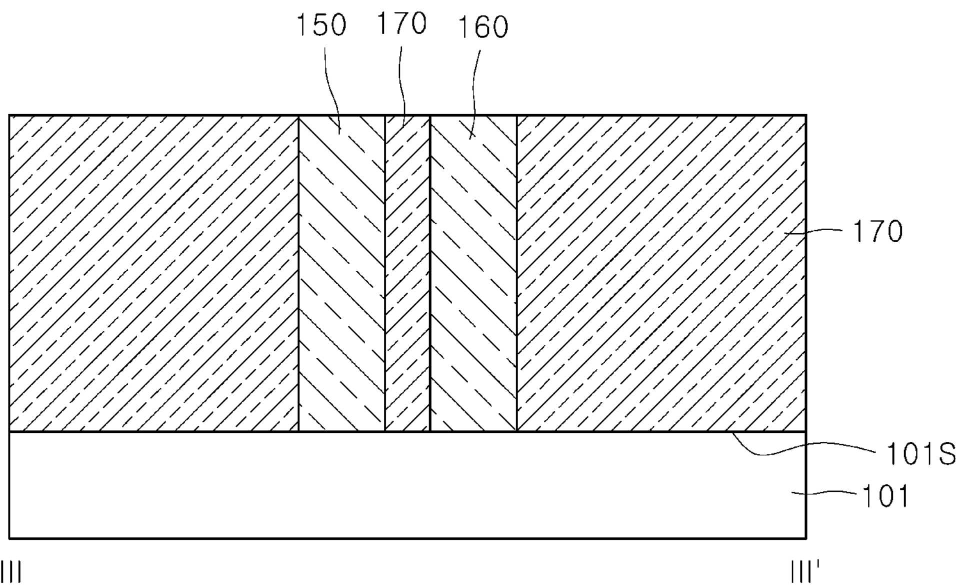
FIG. 7 is a cross-sectional view of the ferroelectric memory device of FIG. 4 taken along line III-III'.
Figure 7:
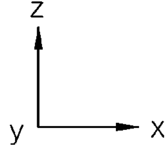
Figure 8:
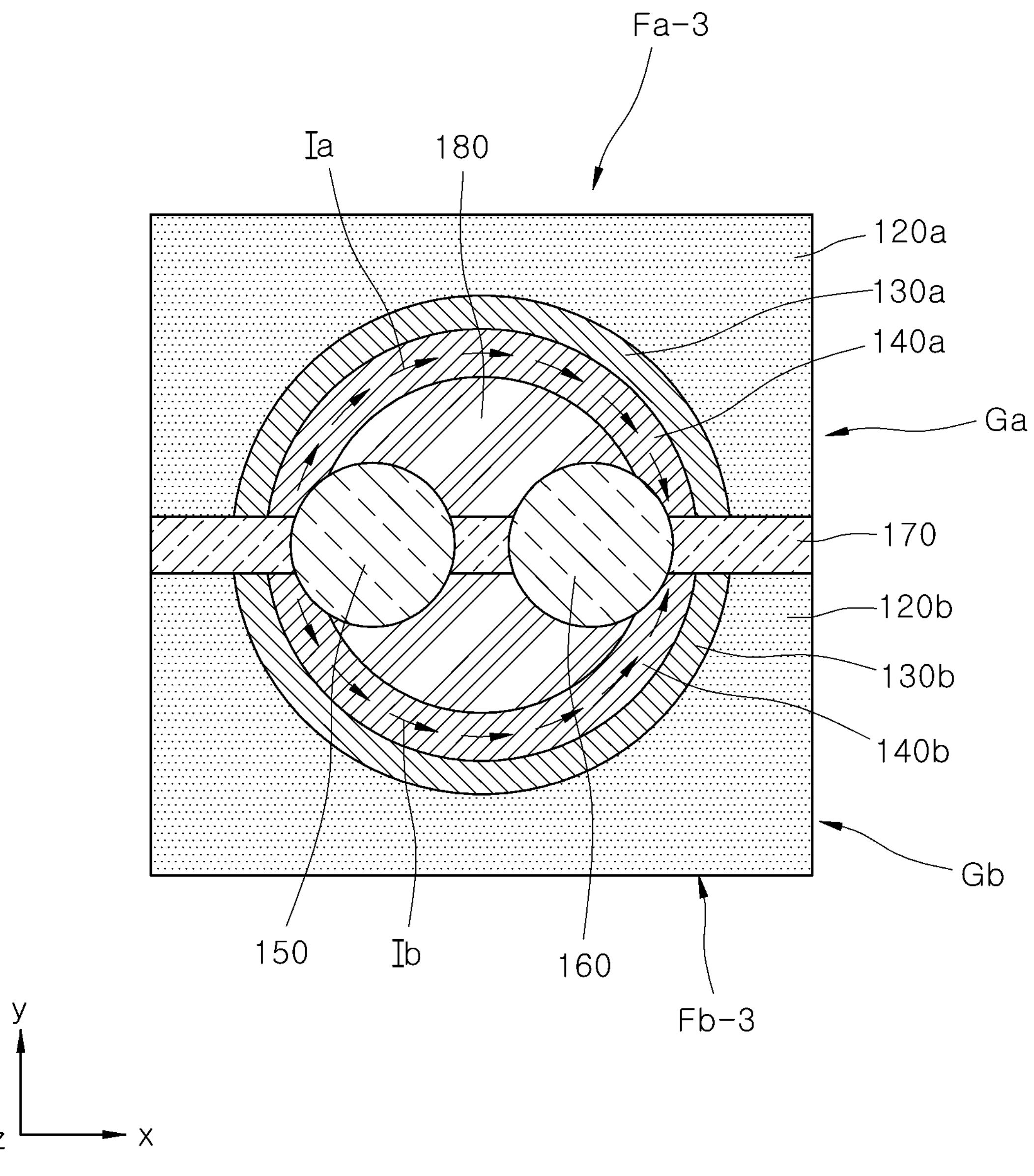
FIG. 8 is a cross-sectional view of the ferroelectric memory device of FIG. 4 taken along a cross section parallel to a surface of a substrate and shown on an x-y plane.

FIG. 4 is a plan view schematically illustrating a three-dimensional ferroelectric memory device according to an embodiment of the present disclosure. FIG. 5 is a cross-sectional view of the ferroelectric memory device of FIG. 4 taken along line I-I'. FIG. 6 is a cross-sectional view of the ferroelectric memory device of FIG. 4 taken along line II-II'. FIG. 7 is a cross-sectional view of the ferroelectric memory device of FIG. 4 taken along line III-III'. FIG. 8 is a cross-sectional view of the ferroelectric memory device of FIG. 4 taken along a cross section parallel to a surface of a substrate and shown on an x-y plane. Specifically, FIG. 8 is a view illustrating the ferroelectric memory device of FIG. 5 taken along line IV-IV' and shown on the x-y plane.

Referring to FIGS. 4 to 8, a ferroelectric memory device UC may include a substrate 101, a gate structure G disposed over the substrate 101, first and second electrode pillars 150 and 160 that are disposed to be spaced apart from each other in a hole H penetrating the gate structure G, and a device isolation structure 170 isolating the gate structure G while crossing the first and second electrode pillars 150 and 160 over the substrate 101.

In some embodiments, at least one layer of conductive layer and at least one layer of insulation layer may be disposed between the substrate 101 and the gate structure G. The conductive layer and the insulation layer may form various circuit patterns. The circuit patterns may serve as interconnection lines.

The substrate 101 may include a semiconductor material. Specifically, the semiconductor material may include silicon (Si), germanium (Ge), gallium arsenide (GaAs), and the like. The substrate 101 may be doped with an n-type or p-type dopant. For example, the substrate 101 may include a well region doped with an n-type or p-type dopant. The substrate 101 may include transistors constituting an integrated circuit. The integrated circuit may include a driver circuit for driving the unit cells of the ferroelectric memory device UC.

In an embodiment, the gate structure G may include a first gate part Ga and a second gate part Gb that are separated from each other by the device isolation structure 170. The first gate part Ga may include a plurality of gate electrode layers 120*a*, a plurality of ferroelectric layers 130*a*, and a plurality of channel layers 140*a*, which are stacked respectively along a first direction (i.e., the z-direction) substantially perpendicular to a surface 101S of the substrate 101. The second gate part Gb may include a plurality of gate electrode layers 120*b*, a plurality of ferroelectric layers 130*b*, and a plurality of channel layers 140*b*, which are stacked respectively along the first direction (i.e., the z-direction) substantially perpendicular to the surface 101S of the substrate 101. The plurality of gate electrode layers 120*a* of the first gate part Ga and the plurality of gate electrode layers 120*b* of the second gate part Gb may be electrically insulated from each other by the device isolation structure 170.

Referring to FIGS. 5 and 6, in the first gate part Ga, among the plurality of gate electrode layers 120*a*, the plurality of ferroelectric layers 130*a*, and the plurality of channel layers 140*a*, one gate electrode layer 120*a*, one ferroelectric layer 130*a*, and one channel layer 140*a* that correspond to each other may be disposed on the same plane. The corresponding gate electrode layer 120*a*, ferroelectric layer 130*a*, and channel layer 140*a* may be sequentially disposed on a plane parallel to the surface 101S of the substrate 101 and may be arranged in a second direction (e.g., a direction perpendicular to the z-direction) that is substantially parallel to the surface 101S of the substrate 101.

The first gate part Ga may include a plurality of interlayer insulation layers 110 that are disposed to be spaced apart from each other in the first direction (i.e., the z-direction). The plurality of interlayer insulation layers 110 may be disposed between the plurality of gate electrode layers 120*a*, the plurality of ferroelectric layers 130*a*, and the plurality of channel layers 140*a*. As shown in FIGS. 5 and 6, among the plurality of interlayer insulation layers 110, a lowermost interlayer insulation layer may be disposed between the substrate 101 and a lowermost gate electrode layer, a lowermost ferroelectric layer, and a lowermost channel layer. In addition, among the plurality of interlayer insulation layers 110, an uppermost interlayer insulation layer may be disposed on an uppermost gate electrode layer, an uppermost ferroelectric layer, and an uppermost channel layer.

Meanwhile, the second gate part Gb may have substantially the same configuration as the first gate part Ga. The second gate part Gb may include the ferroelectric layers 130*b* and the channel layers 140*b*, which are respectively disposed on the same plane to correspond to the plurality of gate electrode layers 120*b*. In addition, the second gate part Gb may include the plurality of insulation layers 110 disposed to be spaced apart from each other in the z-direction.

Each of the plurality of gate electrode layers 120*a* and 120*b* may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Each of the plurality of ferroelectric layers 130*a* and 130*b* may include a ferroelectric material. When an external electric field is applied to the ferroelectric material, the magnitude and orientation of polarization exhibiting hysteresis behavior may be controlled, and the controlled polarization may be stored in a form of remanent polarization after the external electric field is removed. The remanent polarization may be used as a plurality of pieces of signal information in non-volatile storage devices.

In an embodiment, each of the plurality of ferroelectric layers 130*a* and 130*b* may include a ferroelectric material such as metal oxide having a crystal structure of an orthorhombic system. The metal oxide may include, for example, hafnium oxide, zirconium oxide, hafnium zirconium oxide, or a combination of two or more thereof. In an embodiment, each of the plurality of ferroelectric layers 130*a* and 130*b* may include a dopant that is doped into the ferroelectric material.

The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination thereof. As an example, the dopant may help the ferroelectric layers 130*a* and 130*b* to maintain a crystal structure of the orthorhombic system, thereby stabilizing the ferroelectric characteristics of the ferroelectric layers 130*a* and 130*b*.

In another embodiment, each of the plurality of ferroelectric layers 130*a* and 130*b* may include metal oxide having a perovskite structure as the ferroelectric material. The metal oxide may include, for example, barium titanium oxide ($BaTiO_3$), lead titanium oxide ($PbTiO_3$), barium strontium titanium oxide ($(Ba,Sr)TiO_3$, BST), lithium niobium oxide ($LiNbO_3$), and the like.

Each of the plurality of channel layers 140*a* and 140*b* may include a semiconductor material. The semiconductor material may include, for example, silicon (Si), germanium (Ge), gallium arsenide (GaAs), and the like. The semiconductor material may include, for another example, a two-dimensional semiconductor material. The two-dimensional semiconductor material may include transition metal dichalcogenide (TMDC), black phosphorus, and the like. The transition metal dichalcogenide (TMDC) may include, for example, molybdenum selenide ($MoSe_2$), hafnium selenide ($HfSe_2$), indium selenide (InSe), gallium selenide (GaSe), and the like. The semiconductor material may include, for example, metal oxide such as indium-gallium-zinc oxide (IGZO). Each of the plurality of channel layers 140*a* and 140*b* may be doped with an n-type or p-type dopant to have conductivity.

Referring to FIGS. 4 to 8, the first and second electrode pillars 150 and 160 may be disposed in the hole H penetrating the gate structure G on the substrate 101. In an embodiment, the hole H may form a space in a form of a cylindrical pillar, an elliptical pillar, or a polygonal pillar inside the gate structure G, and may expose the substrate 101. The hole H may expose the plurality of first and second channel layers 140*a* and 140*b* and the plurality of interlayer insulation layers 110 in the second direction (e.g., the direction perpendicular to the z-direction).

The first and second electrode pillars 150 and 160 may be conductive structures. Each of the first and second electrode pillars 150 and 160 may include, for example, a conductive material such as a doped semiconductor material, metal, conductive metal nitride, conductive metal carbide, conductive metal silicide, or conductive metal oxide.

The first and second electrode pillars 150 and 160 may be electrically connected to the substrate 101. In an embodiment, the first and second electrode pillars 150 and 160 may be disposed to contact the substrate 101. The first and second electrode pillars 150 and 160 may extend along the first direction (i.e., the z-direction) substantially perpendicular to the surface 101S of the substrate 101. In addition, the first and second electrode pillars 150 and 160 may be disposed to be spaced apart from each other in the second direction (e.g., the direction perpendicular to the z-direction), which is substantially parallel to the surface 101S of the substrate 101. In FIGS. 5, 6, and 8, the first and second electrode pillars 150 and 160 are illustrated as cylindrical pillars, but other embodiments are not necessarily limited thereto, and other forms include an elliptical pillar or a polygonal pillar.

The first electrode pillar 150 may be electrically connected to the plurality of first channel layers 140*a* of the first gate part Ga and the plurality of second channel layers 140*b* of the second gate part Gb. Referring to FIGS. 4, 5, 6, and 8, portions of an outer circumferential surface of the first electrode pillar 150 may be disposed to contact the plurality of first channel layers 140*a* and the plurality of second channel layers 140*b* in the second direction. In order for the first electrode pillar 150 to contact the plurality of first and second channel layers 140*a* and 140*b*, the portions 150*p* of the first electrode pillar 150 may protrude into the first and second gate parts Ga and Gb beyond the hole H.

Similarly, the second electrode pillar 160 may be electrically connected to the plurality of first channel layers 140*a* and the plurality of second channel layers 140*b*. Referring to FIGS. 4, 5, 6, and 8, portions of the outer circumferential surface of the second electrode pillar 160 may be disposed to contact the plurality of first channel layers 140*a* and the plurality of second channel layers 140*b* in the second direction. In order for the second electrode pillar 160 to contact the plurality of first and second channel layers 140*a* and 140*b*, the portions 160*p* of the second electrode pillar 160 may protrude into the first and second gate parts Ga and Gb beyond the hole H.

In an embodiment, referring to FIGS. 4 and 8, the plurality of first and second channel layers 140*a* and 140*b* may be disposed along a circumference of the hole H. The plurality of first and second ferroelectric layers 130*a* and 130*b* may be disposed to surround the plurality of first and second channel layers 140*a* and 140*b*, and the plurality of first and second gate electrode layers 120*a* and 120*b* may be disposed to surround the plurality of first and second ferroelectric layers 130*a* and 130*b*.

Referring to FIGS. 4, 6, and 8, the device isolation structure 170 may be disposed to cross the first and second electrode pillars 150 and 160. Remaining space in the hole H in which the first and second electrode pillars 150 and 160 and the device isolation structure 170 are disposed may be filled with a hole filling material 180.

In an embodiment, the device isolation structure 170 may be disposed to extend in a direction (e.g., the x-direction) substantially parallel to the surface 101S of the substrate 101. In an embodiment, the device isolation structure 170 may be a wall structure that has a predetermined width w in the y-direction and a predetermined height h in the z-direction, and extends in the x-direction. The width w of the device isolation structure 170 may be smaller than a diameter D of the hole H. In addition, the height h of the device isolation structure 170 may be substantially equal to or greater than a height h0 of the gate structure G. Referring to FIG. 4, the device isolation structure 170 may contact the first and second electrode pillars 150 and 160 while crossing the hole H in the direction (e.g., the x-direction) parallel to the surface 101S of the substrate 101.

Referring to FIGS. 4 to 8, the first gate part Ga may include four gate electrode layers 120*a*, four ferroelectric layers 130*a*, and four channel layers 140*a*. The first and second electrode pillars 150 and 160 may electrically interact with the four gate electrode layers 120*a*, the four ferroelectric layers 130*a*, and the four channel layers 140*a* of the first gate part Ga. Similarly, the second gate part Gb may include four gate electrode layers 120*b*, four ferroelectric layers 130*b*, and four channel layers 140*b*. The first and second electrode pillars 150 and 160 may electrically interact with the four gate electrode layers 120*b*, the four ferroelectric layers 130*b*, and the four channel layers 140*b* of the second gate part Gb.

One gate electrode layer 120*a*, one ferroelectric layer 130*a*, and one channel layer 140*a* of the first gate part Ga, positioned on one of the planes parallel to the surface 101S of the substrate 101, may constitute a first ferroelectric memory cell, and one gate electrode layer 120*b*, one ferroelectric layer 130*b*, and one channel layer 140*b* of the second gate part Gb, positioned on the same plane may constitute a second ferroelectric memory cell corresponding to the first ferroelectric memory cell. Accordingly, the first gate part Ga may constitute four first ferroelectric memory cells, and the second gate part Gb may constitute four second ferroelectric memory cells.

Among the first ferroelectric memory cells and the second ferroelectric memory cells, each corresponding first and second ferroelectric memory cell pair may constitute one unit TCAM cell. As an example, the first and second ferroelectric memory cells may correspond to the first and second ferroelectric field effect transistors FET1 and FET2 of the unit TCAM cell TC of FIG. 2, respectively. The first and second electrode pillars 150 and 160 may correspond to the matching line ML and bit line BL of the unit TCAM cell TC of FIG. 2, respectively. Referring to FIGS. 5 and 6, four pairs of corresponding first ferroelectric memory cells Fa-1, Fa-2, Fa-3, and Fa-4 and second ferroelectric memory cells Fb-1, Fb-2, Fb-3, and Fb-4 may constitute four unit TCAM cells.

Hereinafter, in an embodiment, an operating method of the unit TCAM cell including the first and second ferroelectric memory cells Fa-3 and Fb-3 will be schematically described using FIG. 8. An operation of storing information in the unit TCAM cell may proceed with an operation of writing a polarization signal in each of the first and second ferroelectric memory cells Fa-3 and Fb-3.

A write operation to the first ferroelectric memory cell Fa-3 may be performed by writing a polarization signal of '0' or '1' in the first ferroelectric layer 130*a* using a first gate voltage applied through the first gate electrode layer 120*a*. In this case, the first and second electrode pillars 150 and 160 may be grounded or may maintain the same potential as each other. According to the written polarization signal, the first ferroelectric memory cell Fa-3 may have one of first and second threshold voltages Vth1 and Vth2, which have different magnitudes. The first and second threshold voltages Vth1 and Vth2 may have positive values, and the second threshold voltage Vth2 may be greater than the first threshold voltage Vth1. Similarly, a write operation to the second ferroelectric memory cell Fb-3 may be performed by writing a polarization signal of '0' or '1' in the second ferroelectric layer 130*b* using a second gate voltage applied through the second gate electrode layer 120*b*. The first and second electrode pillars 150 and 160 may be grounded or may maintain the same potential as each other. According to the written polarization signal, the second ferroelectric memory cell Fb-3 may have one of the first and second threshold voltages Vth1 and Vth2 having different magnitudes.

As a result, stored information '0' of the unit TCAM cell may mean that the polarization signal '0' is written in the first ferroelectric memory cell Fa-3 and the polarization signal '1' is written in the second ferroelectric memory cell Fb-3. In addition, stored information '1' of the unit TCAM cell may mean that the polarization signal '1' is written in the first ferroelectric memory cell Fa-3 and the polarization signal '0' is written in the second ferroelectric memory cell Fb-3. In an embodiment, stored information 'X' of the unit TCAM cell may mean that the polarization signal '1' is written in the first ferroelectric memory cell Fa-3 and the polarization signal '1' is written in the second ferroelectric memory cell Fb-3.

In an embodiment, a search operation of the unit TCAM cell may proceed as follows. Searching for search information '0' for the unit TCAM cell may be performed by applying a gate voltage corresponding to the search signal '0' to the first gate electrode layer 120*a* and applying a gate voltage corresponding to the search signal '1' to the second gate electrode layer 120*b*. In addition, searching for search information '1' for the unit TCAM cell may be performed by applying the gate voltage corresponding to the search signal '1' to the first gate electrode layer 120*a* and applying the gate voltage corresponding to the search signal '0' to the second gate electrode layer 120*b*. In addition, searching for search information 'X' for the unit TCAM cell may be performed by applying the gate voltage corresponding to the search signal '0' to the first gate electrode layer 120*a* and applying the gate voltage corresponding to the search signal '0' to the second gate electrode layer 120*b*.

In an embodiment, while the search operation is in progress, a reference voltage Vm may be applied to the first electrode pillar 150, and the second electrode pillar 160 may be grounded. The gate voltage corresponding to the search signal '0' may be 0 V, and the gate voltage corresponding to the search signal '1' may mean a voltage Vr that is greater than the first threshold voltage Vth1 and less than the second threshold voltage Vth2.

When the gate voltage corresponding to the search signal '0' is applied, the ferroelectric memory cells Fa-3 and Fb-3 may maintain turned off states regardless of the polarization signals stored in the ferroelectric layers 130*a* and 130*b*. Accordingly, a current conducting between the first and second electrode pillars 150 and 160 through the channel layers 140*a* and 140*b* may maintain a leakage current level.

On the other hand, when the gate voltage corresponding to the search signal '1' is applied, the ferroelectric memory cells Fa-3 and Fb-3 may be turned on when the polarization signal '0' is stored in the respective ferroelectric layers 130*a* and 130*b*, and may maintain the turned off states when the polarization signal '1' is stored in the respective ferroelectric layers 130*a* and 130*b*.

As shown in FIG. 8, when the first ferroelectric memory cell Fa-3 is turned on, a conductive channel may be formed in the channel layer 140*a*, and a first operation current Ia may conduct from the first electrode pillar 150 to the second electrode pillar 160. When the second ferroelectric memory cell Fb-3 is turned on, a conductive channel may be formed in the channel layer 140*b*, and a second operation current Ib may conduct from the first electrode pillar 150 to the second electrode pillar 160.

Through the above-described operations, when the reference voltage Vm of the first electrode pillar 150 is maintained while the search operation is in progress, it may be determined that the stored information of the unit TCAM cell connected to the first electrode pillar 150 matches the search information input in the unit TCAM cell. On the other hand, when the reference voltage Vm of the first electrode pillar 150 drops while the search operation is in progress, it may be determined that the stored information of the unit TCAM cell connected to the first electrode pillar 150 does not match the search information input in the unit TCAM cell.

FIGS. 4 to 8 disclose a ferroelectric memory device including four unit TCAM cells stacked along the z-axis, but in another embodiment of the present disclosure, the number of stacked unit TCAM cells is not necessarily limited to four, and the unit TCAM cells may be stacked in various numbers in other embodiments.

As described above, the ferroelectric memory device according to an embodiment of the present disclosure may include a plurality of unit TCAM cells stacked in the z-direction over a substrate. Each of the plurality of unit TCAM cells may include a pair of ferroelectric memory cells separated from each other by a device isolation structure.

Each of the pair of ferroelectric memory cells may include a gate electrode layer, a ferroelectric layer, and a channel layer disposed on a plane parallel to a surface of the substrate. In addition, the pair of ferroelectric memory cells may electrically share first and second electrode pillars extending in a direction perpendicular to the surface of the substrate. Through the above configuration, it is possible to provide a ferroelectric memory device having a three-dimensional structure including TCAM cells having improved cell integration over the substrate.

Figure 9:
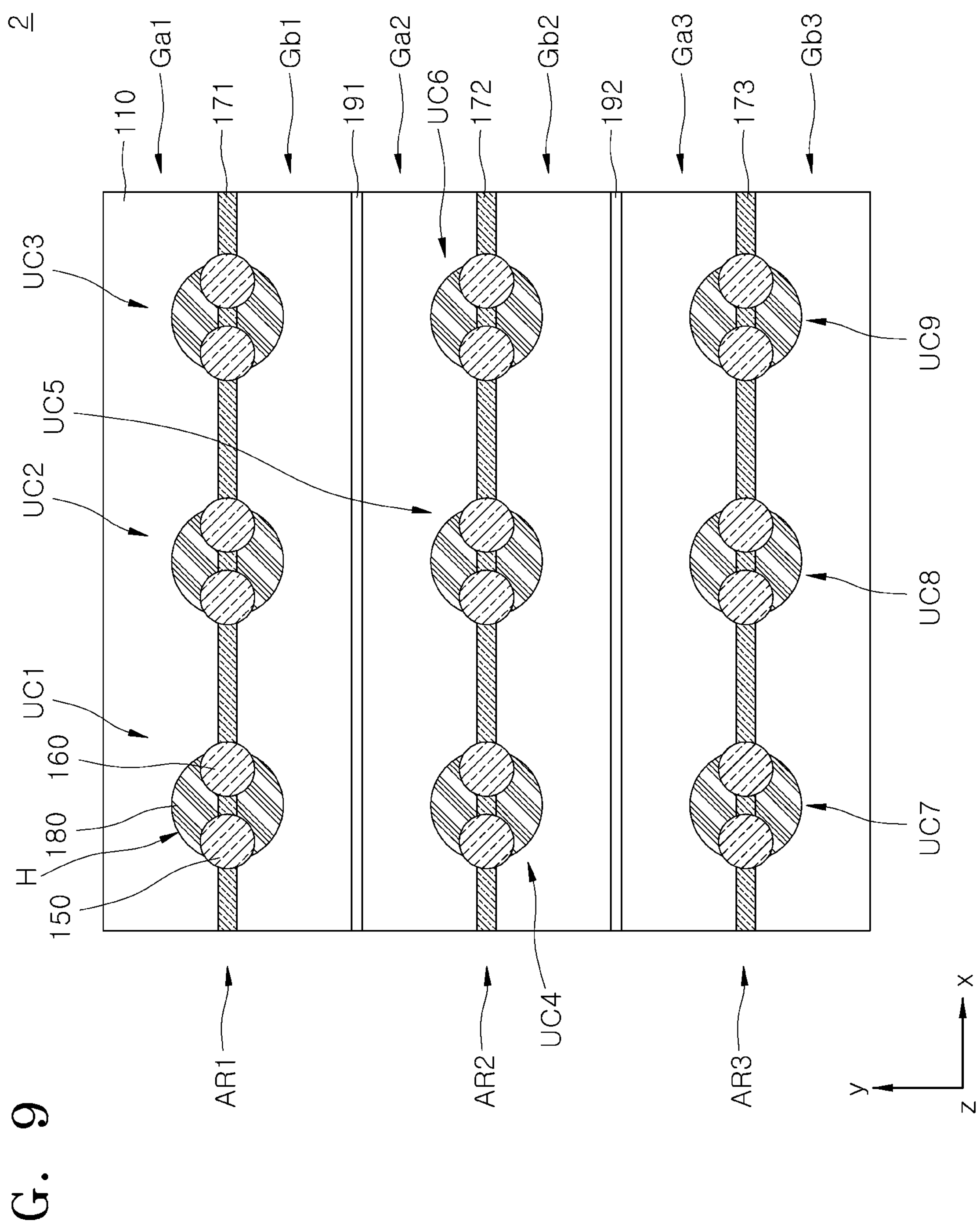
FIG. 9 is a plan view schematically illustrating a ferroelectric memory device according to another embodiment of the present disclosure.

FIG. 9 is a plan view schematically illustrating a ferroelectric memory device according to another embodiment of the present disclosure. Referring to FIG. 9, a ferroelectric memory device 2 may include arrays of the ferroelectric memory device UC described above with reference to FIGS. 4 to 8. The same reference numerals as those in FIGS. 4 to 8 denote the same components.

The ferroelectric memory device 2 may include first to third memory arrays AR1, AR2, and AR3 arranged in a direction (i.e., the y-direction) parallel to a surface (101S of FIG. 6) of a substrate (101 of FIG. 6). The first memory array AR1 may include first to third ferroelectric memory devices UC1, UC2, and UC3 disposed along another direction (i.e., the x-direction) parallel to the surface 101S of the substrate 101. The second memory array AR2 may include fourth to sixth ferroelectric memory devices UC4, UC5, and UC6 disposed along the x-direction. The third memory array AR3 may include seventh to ninth ferroelectric memory devices UC7, UC8, and UC9 disposed along the x-direction.

A configuration of each of the first to ninth ferroelectric memory devices UC1, UC2, UC3, UC4, UC5, UC6, UC7, UC8, and UC9 may be substantially the same as the configuration of the ferroelectric memory device UC described above with reference to FIGS. 4 to 8. In an embodiment, the ferroelectric memory device 2 may include a substrate, a gate structure disposed over the substrate and including a plurality of gate electrode layers spaced apart from each other along a first direction (i.e. z-direction) substantially perpendicular to a surface of the substrate. The ferroelectric memory device 2 may include a plurality of holes H penetrating the gate structure over the substrate. The plurality of holes H are arranged along a second direction (i.e. x-direction) and a third direction (i.e. y-direction) that are substantially parallel to the surface of the substrate, respectively.

The ferroelectric memory device 2 may include first and second electrode pillars 150 and 160 disposed to extend along the first direction (i.e. z-direction) inside the plurality of holes H, and a device isolation structure 171, 172, and 173 disposed over the substrate to cross the plurality of holes H and to extend along the second direction (i.e. x-direction). The gate structure further includes a plurality of ferroelectric layers and a plurality of channel layers that are disposed to correspond to the plurality of gate electrode layers. The first and second electrode pillars 150 and 160 are disposed to be electrically connected to the plurality of channel layers.

The first memory array AR1 may include a first gate part Ga1 and a second gate part Gb1 that are separated from each other, based on a first device isolation structure 171. The second memory array AR2 may include a first gate part Ga2 and a second gate part Gb2 that are separated from each other, based on a second device isolation structure 172. The third memory array AR3 may include a first gate part Ga3 and a second gate part Gb3 that are separated from each other, based on a third device isolation structure 173.

The first memory array AR1 and the second memory array AR2 may be separated from each other by a first gate isolation structure 191. The first gate isolation structure 191 may be a wall structure disposed over the substrate 101 and extending in the x-direction. The second gate part Gb1 of the first memory array AR1 and the first gate part Ga2 of the second memory array AR2 may be separated from each other by the first gate isolation structure 191 over the substrate 101. Accordingly, a plurality of gate electrode layers 120*b* of the second gate part Gb1 of the first memory array AR1 and a plurality of gate electrode layers 120*a* of the first gate part Ga2 of the second memory array AR2 may be electrically separated from each other.

The second memory array AR2 and the third memory array AR3 may be separated from each other by a second gate isolation structure 192. The second gate isolation structure 192 may be a wall structure disposed over the substrate 101 and extending in the x-direction. The second gate part Gb2 of the second memory array AR2 and the first gate part Ga3 of the third memory array AR3 may be separated from each other by the second gate isolation structure 192 over the substrate 101. Accordingly, a plurality of gate electrode layers 120*b* of the second gate part Gb2 of the second memory array AR2 and a plurality of gate electrode layers 120*a* of the first gate part Ga3 of the third memory array AR3 may be electrically separated from each other.

In FIG. 9, each of the first to third memory arrays AR1, AR2, and AR3 includes three ferroelectric memory devices, but other embodiments are not limited thereto and may include various numbers of ferroelectric memory devices. In addition, FIG. 9 illustrates three memory arrays AR1, AR2, and AR3, but the present disclosure is not necessarily limited thereto and other embodiments may include various numbers of memory arrays.

As described above, the ferroelectric memory device 2 according to an embodiment of the present disclosure may include a plurality of memory arrays arranged along a first direction. Each of the plurality of memory arrays may include a plurality of unit TCAM cells arranged along a second direction different from the first direction. Referring to FIG. 9, the plurality of unit TCAM cells belonging to the same memory array may share a pair of gate parts extending in the second direction. Accordingly, it is possible to provide a ferroelectric memory device 2 having a three-dimensional structure capable of implementing arrays of the plurality of unit TCAM cells with improved cell integration.

Figure 10:
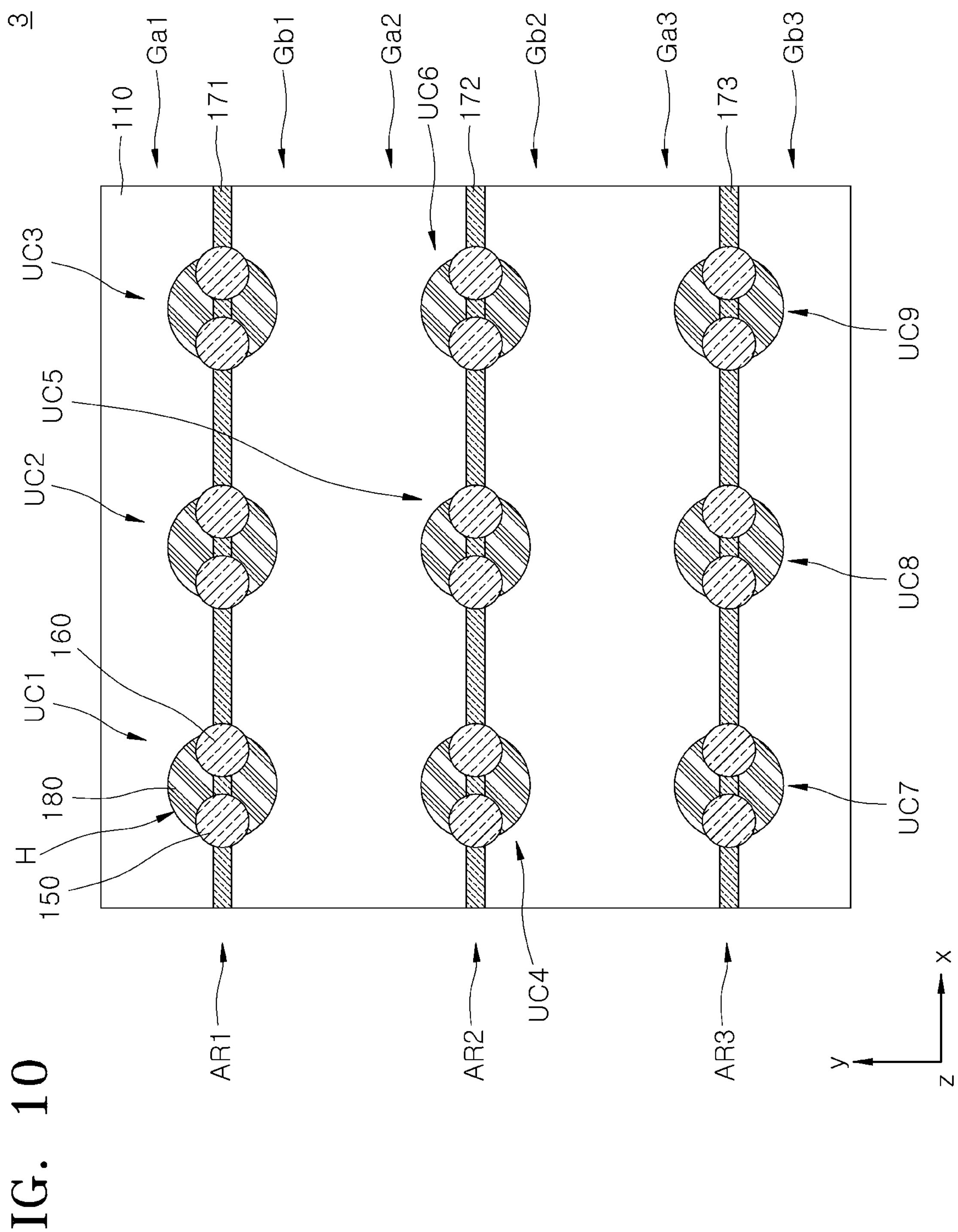
FIG. 10 is a plan view schematically illustrating a ferroelectric memory device according to further another embodiment of the present disclosure.

FIG. 10 is a plan view schematically illustrating a ferroelectric memory device according to another embodiment of the present disclosure. Compared to the ferroelectric memory device 2 of FIG. 9, in a ferroelectric memory device 3 of FIG. 10, first and second gate isolation structures 191 and 192 may be omitted from the ferroelectric memory device 2 of FIG. 9. The same reference numerals as those in FIG. 9 denote the same components.

Referring to FIG. 10, in the ferroelectric memory device 3, a second gate part Gb1 of a first memory array AR1 and a first gate part Ga2 of a second memory array AR2 may be electrically connected to each other. Accordingly, the same gate voltage may be simultaneously applied to a gate electrode layer 120*b* in the second gate part Gb1 of the first memory array AR1 and a gate electrode layer 120*a* in the first gate part Ga2 of the second memory array AR2. Similarly, a second gate part Gb2 of the second memory array AR2 and a first gate part Ga3 of a third memory array AR3 may be electrically connected to each other. Accordingly, the same gate voltage may be simultaneously applied to a gate electrode layer 120*b* in the second gate part Gb2 of the second memory array AR2 and a gate electrode layer 120*a* in the first gate part Ga3 of the third memory array AR3. Accordingly, the ferroelectric memory device 3 of FIG. 10 may provide a three-dimensional ferroelectric memory device having an electrical circuit configuration different from that of a ferroelectric memory device 2 of FIG. 9. Redundant descriptions of the remaining elements identical to those of FIG. 9 will be omitted.

Figure 11A:
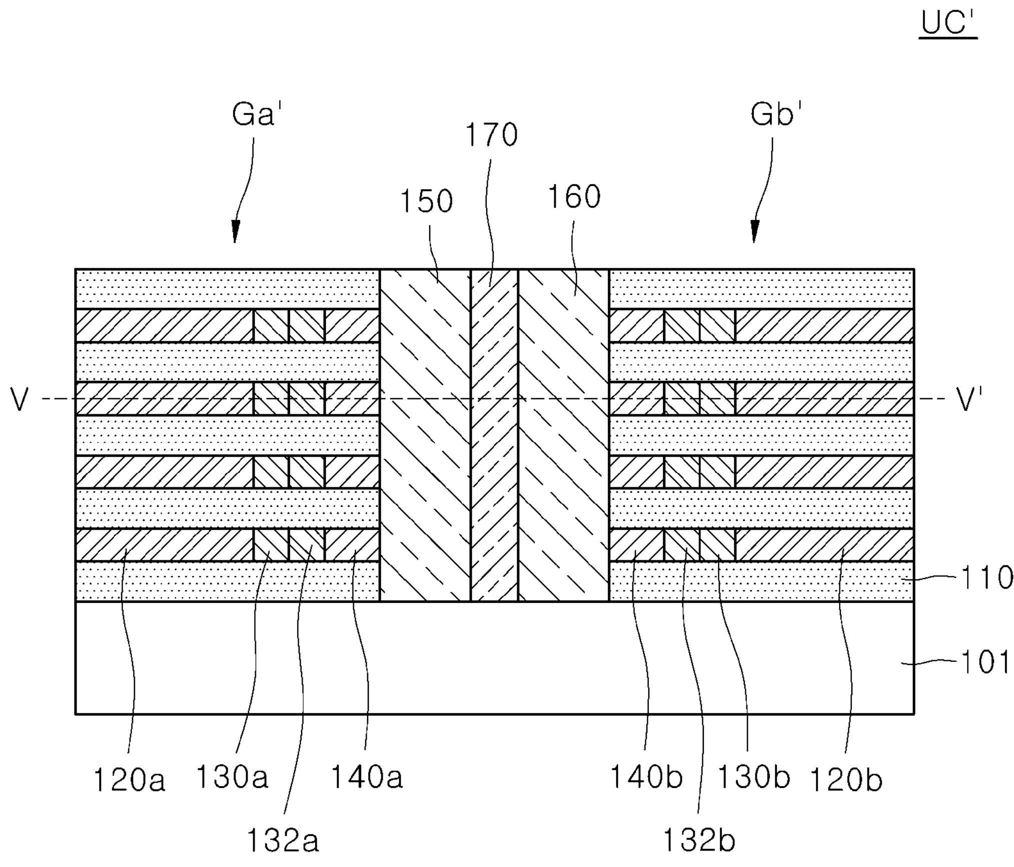
FIG. 11A is a cross-sectional view schematically illustrating a ferroelectric memory device according to further another embodiment of the present disclosure.
Figure 11A:
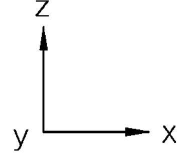
Figure 11B:
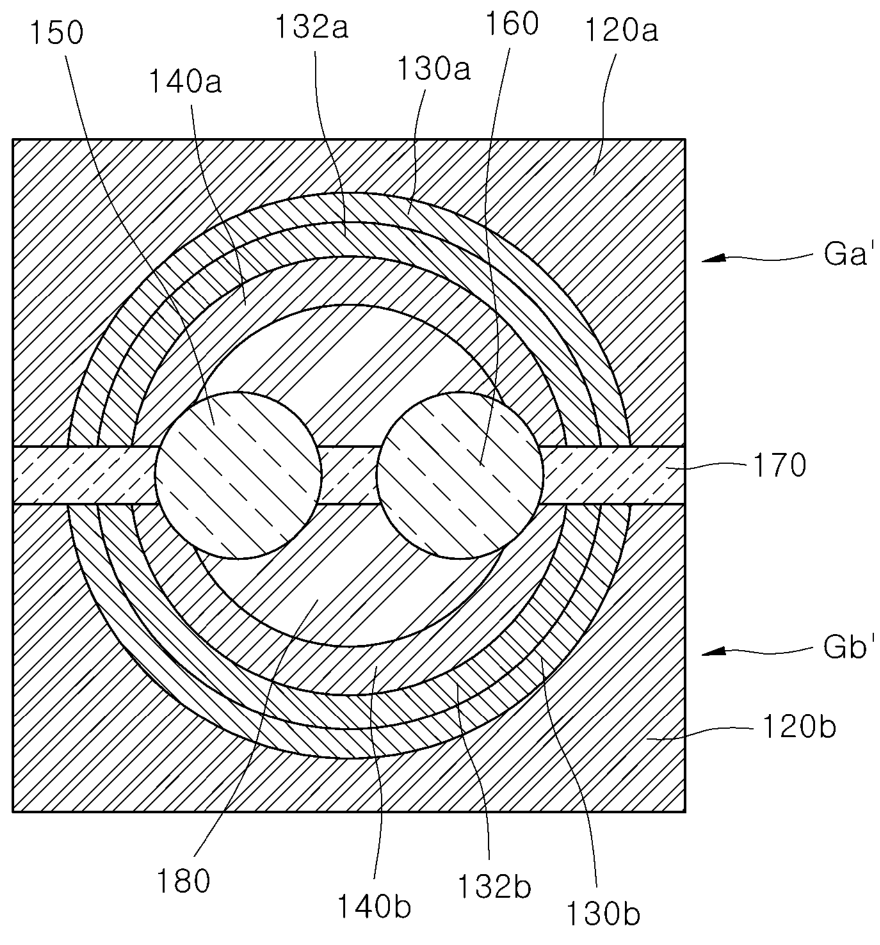
FIG. 11B is a cross-sectional view of a ferroelectric memory device of FIG. 11A taken along line V-V' and shown on an x-y plane.
Figure 11B:
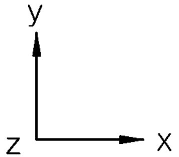

FIG. 11A is a cross-sectional view schematically illustrating a ferroelectric memory device according to another embodiment of the present disclosure. FIG. 11B is a cross-sectional view of a ferroelectric memory device of FIG. 11A taken along line V-V' and shown on an x-y plane.

Referring to FIGS. 11A and 11B, compared to a ferroelectric memory device UC of FIGS. 4 to 8, a ferroelectric memory device UC' may further include a plurality of interfacial dielectric layers 132*a* and 132*b*.

The plurality of interfacial dielectric layers 132*a* and 132*b* of a first and second gate part Ga' and Gb' may be disposed between a plurality of ferroelectric layers 130*a* and 130*b* and a plurality of channel layers 140*a* and 140*b*, respectively. The plurality of interfacial dielectric layers 132*a* and 132*b* may be disposed to surround corresponding channel layers 140*a* and 140*b*. In addition, the plurality of ferroelectric layers 130*a* and 130*b* may be disposed to surround corresponding interfacial dielectric layers 132*a* and 132*b*.

When the plurality of ferroelectric layers 130_a_ and 130_b_ are in direct contact with the plurality of channel layers 140_a_ and 140_b_ without the plurality of interfacial dielectric layers 132_a_ and 132_b_, defects may occur at interfaces between the plurality of ferroelectric layers 130_a_ and 130_b_ and the plurality of channel layers 140_a_ and 140_b_ due to a difference in lattice constant. In contrast, the plurality of interfacial dielectric layers 132_a_ and 132_b_ of the ferroelectric memory device UC' of FIGS. 11A and 11B may function as buffer layers that relieve stress caused by the difference in lattice constant between the plurality of ferroelectric layers 130_a_ and 130_b_ and the plurality of channel layers 140_a_ and 140_b_.

Each of the plurality of interfacial dielectric layers 132_a_ and 132_b_ may have non-ferroelectric characteristics. Each of the plurality of interfacial dielectric layers 132_a_ and 132_b_ may have paraelectricity. Each of the plurality of interfacial dielectric layers 132_a_ and 132_b_ may include, for example, oxide, nitride, or oxynitride. Each of the plurality of interfacial dielectric layers 132_a_ and 132_b_ may have an amorphous structure. Alternatively, each of the plurality of interfacial dielectric layers 132_a_ and 132_b_ may have a crystalline structure. In this case, a lattice constant of each of the plurality of interfacial dielectric layers 132_a_ and 132_b_ may have a magnitude between a lattice constant of each of the plurality of ferroelectric layers 130_a_ and 130_b_ and a lattice constant of each of the plurality of channel layers 140_a_ and 140_b_.

Figure 12A:
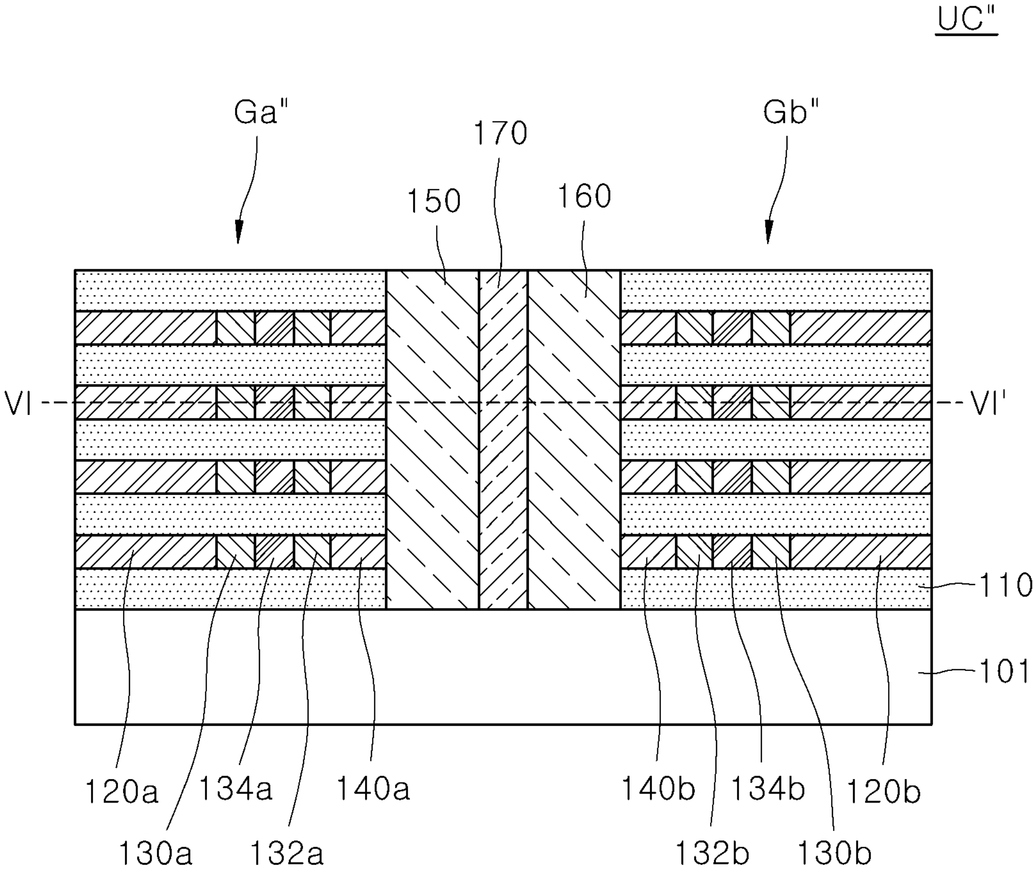
FIG. 12A is a cross-sectional view schematically illustrating a ferroelectric memory device according to another embodiment of the present disclosure.
Figure 12A:
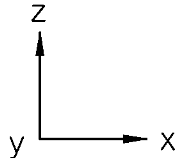
Figure 12B:
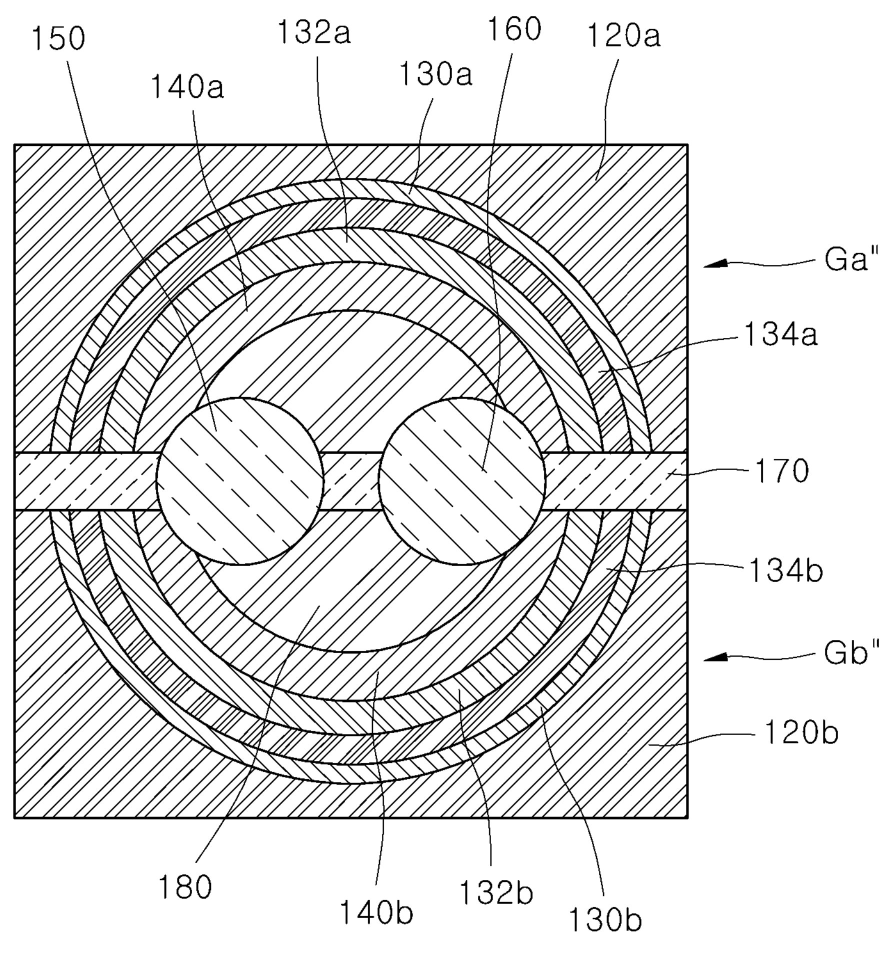
FIG. 12B is a cross-sectional view of a ferroelectric memory device of FIG. 12A taken along line VI-VI' and shown on an x-y plane.

FIG. 12A is a cross-sectional view schematically illustrating a ferroelectric memory device according to another embodiment of the present disclosure. FIG. 12B is a cross-sectional view of a ferroelectric memory device of FIG. 12A taken along line VI-VI' and shown on an x-y plane.

Referring to FIGS. 12A and 12B, compared to a ferroelectric memory device UC' of FIGS. 11A and 11B, the ferroelectric memory device UC" may further include a plurality of floating electrode layers 134_a_ and 134_b_.

Each of the plurality of floating electrode layers 134_a_ and 134_b_ of a first and second gate part Ga" and Gb" may be disposed between each of the plurality of ferroelectric layers 130_a_ and 130_b_ and each of the plurality of interfacial dielectric layers 132_a_ and 132_b_, respectively. The plurality of floating electrode layers 134_a_ and 134_b_ may be disposed to surround the corresponding interfacial dielectric layers 132_a_ and 132_b_. In addition, the plurality of ferroelectric layers 130_a_ and 130_b_ may be disposed to surround the corresponding floating electrode layers 134_a_ and 134_b_.

When the plurality of ferroelectric layers 130_a_ and 130_b_ are in direct contact with the plurality of interfacial dielectric layers 132_a_ and 132_b_ without the plurality of floating electrode layers 134_a_ and 134_b_, a depolarization electric field may be formed inside the plurality of ferroelectric layers 130_a_ and 130_b_. In the ferroelectric memory device UC" of FIGS. 12A and 12B, each of the plurality of floating electrode layers 134_a_ and 134_b_ may be disposed between each of the plurality of ferroelectric layers 130_a_ and 130_b_ and each of the plurality of interfacial dielectric layers 132_a_ and 132_b_, so that the formation of the depolarization electric field may be suppressed. As a result, degradation of the ferroelectric polarization formed in the plurality of ferroelectric layers 130_a_ and 130_b_ by the depolarization field may be prevented. Each of the plurality of floating electrode layers 134_a_ and 134_b_ may include a conductive material. Each of the plurality of floating electrode layers 134_a_ and 134_b_ may include, for example, metal. Other configurations, except for the plurality of floating electrode layers 134_a_ and 134_b_, are the same as those of the memory device of FIGS. 11A and 11B, so descriptions are omitted.

FIGS. 13A to 22A are plan views schematically illustrating a method of manufacturing a ferroelectric memory device according to an embodiment of the present disclosure. FIGS. 13B to 22B are cross-sectional views schematically illustrating a method of manufacturing a ferroelectric memory device according to an embodiment of the present disclosure. FIGS. 13B to 22B are cross-sectional views of the structures shown in FIGS. 13A to 22A taken along line A-A'. FIGS. 21C and 22C are cross-sectional views of the structures shown in FIGS. 21A and 22A taken along line B-B', respectively.

Figure 13A:
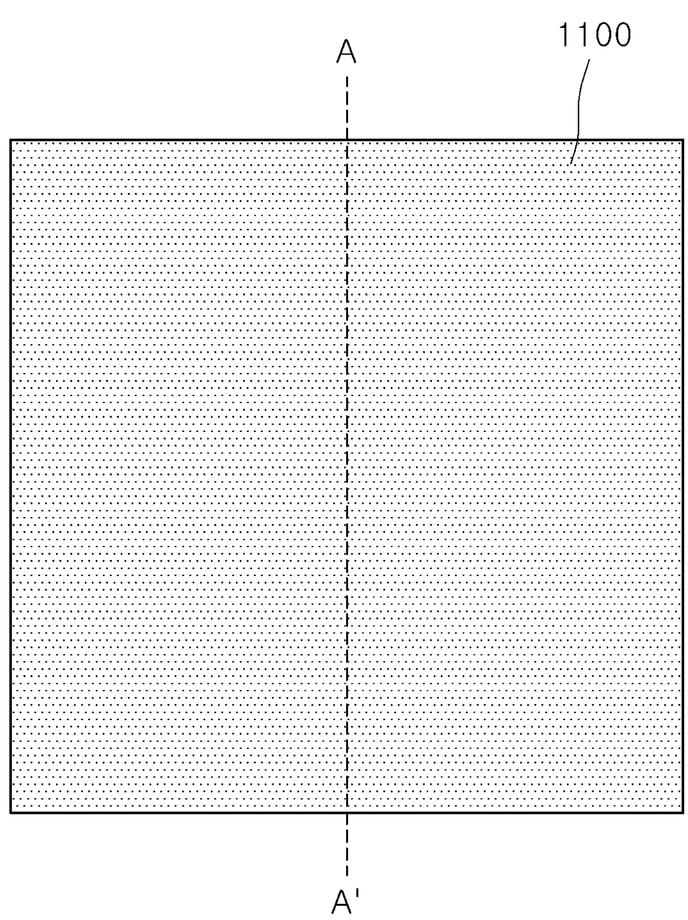
Figure 13A:
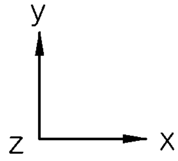
Figure 13B:
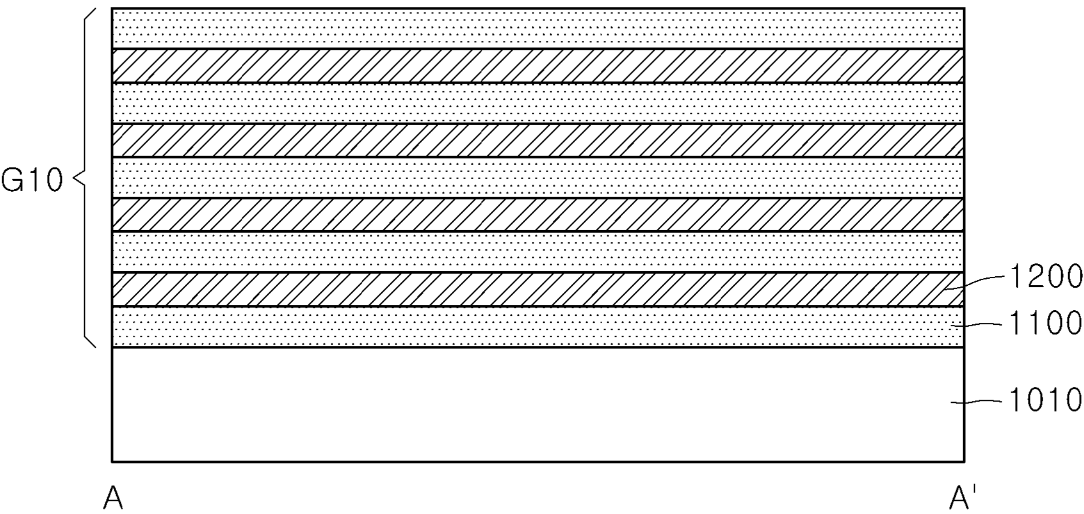
Figure 13B:
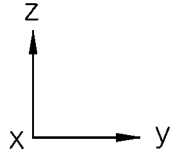

Referring to FIGS. 13A and 13B, a gate stack structure G10 may be formed on a substrate 1010. The gate stack structure G10 may include insulating material layers 1100 and conductive material layers 1200, which are alternatively stacked on the substrate 1010. Among the insulating material layers 1100 and the conductive material layers 1200 of the gate stacked structure G10, the insulating material layers 1100 may be positioned at the lowermost and uppermost portions of the gate stack structure G10.

The substrate 1010 may include a semiconductor material. Specifically, the semiconductor material may include silicon (Si), germanium (Ge), gallium arsenide (GaAs), and the like. The substrate 1010 may be doped with an n-type or p-type dopant. As an example, the substrate 1010 may include a well region doped with an n-type or p-type dopant. The substrate 1010 may include transistors constituting an integrated circuit.

The insulating material layer 1100 may include, for example, oxide, nitride, oxynitride, or a combination of two or more thereof. The insulating material layer 1100 may be formed, for example, using a chemical vapor deposition method, a sputtering method, an atomic layer deposition method, a coating method, and the like. The conductive material layer 1200 may include, for example, a doped semiconductor material, metal, conductive metal nitride, conductive metal carbide, conductive metal silicide, or conductive metal oxide. The conductive material layer 1200 may be formed, for example, using a chemical vapor deposition method, a sputtering method, an atomic layer deposition method, and the like.

Figure 14A:
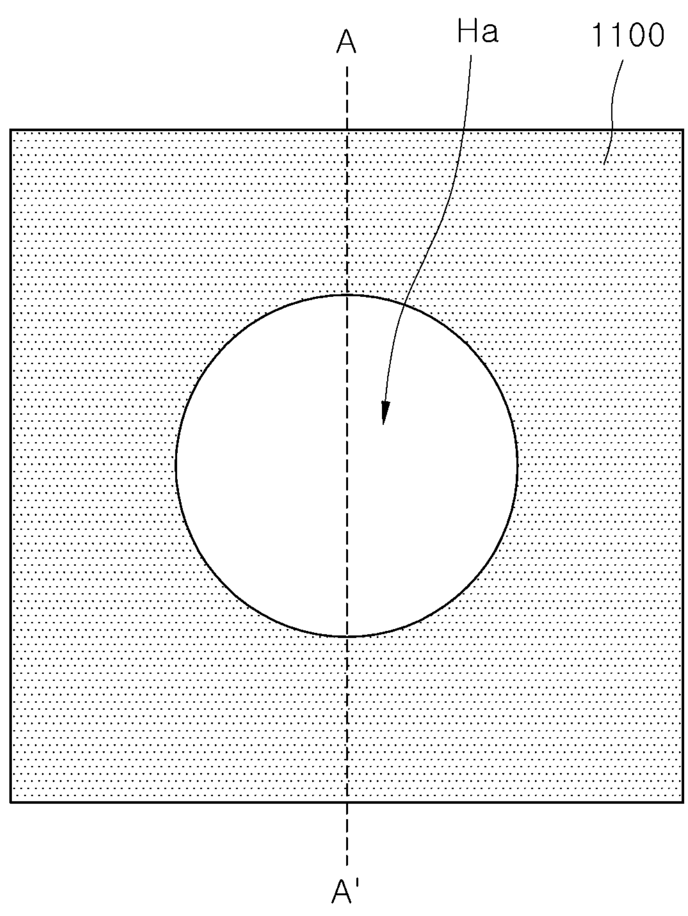
Figure 14A:
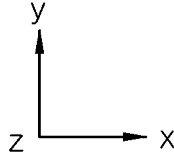
Figure 14B:
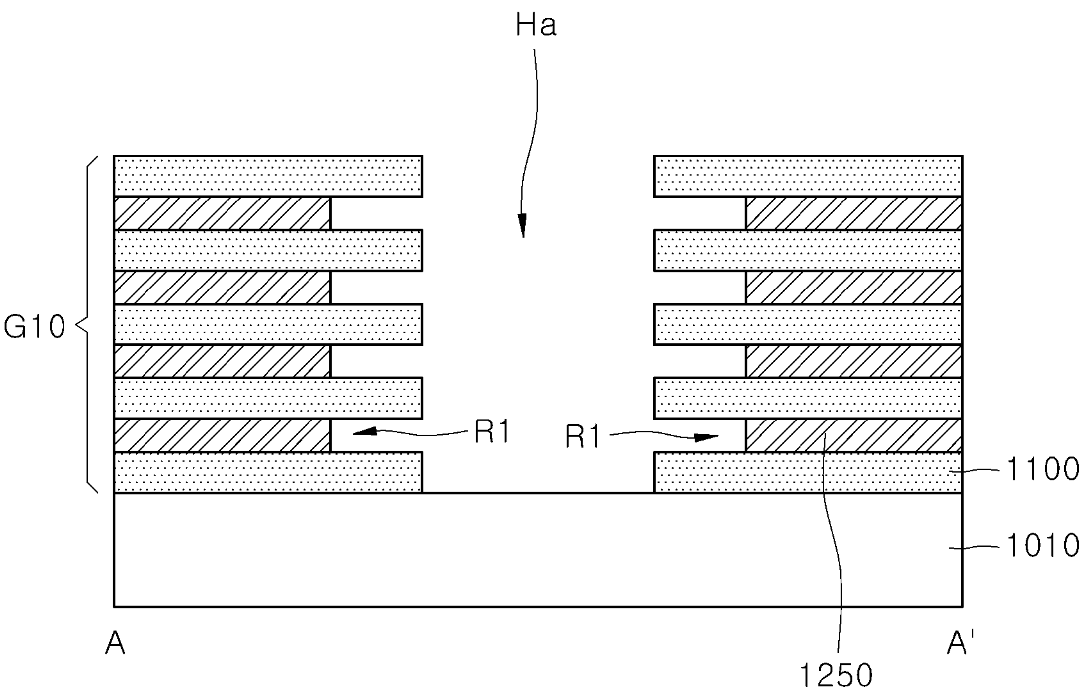
Figure 14B:
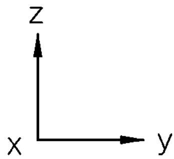

Referring to FIGS. 14A and 14B, a first hole Ha may be formed to penetrate the gate stack structure G10 on the substrate 1010. In an embodiment, the first hole Ha may be formed by selectively etching the insulating material layers 1100 and the conductive material layers (1200 of FIG. 13B) using an anisotropic etching method.

The first hole Ha may form a space in the form of a cylinder, but is not necessarily limited thereto, and may form a space in the form of an elliptical pillar or a polygonal pillar in other embodiments. A bottom surface of the first hole Ha may expose the substrate 1010, and a sidewall surface of the first hole Ha may expose the insulating material layers 1100 and the conductive material layers (1200 of FIG. 13B) of the gate stack structure G10.

Subsequently, the conductive material layers (1200 of FIG. 13B) exposed by the first hole Ha may be partially etched to form first recess spaces R1. In the process of forming the first recess spaces R1, the conductive material layers (1200 of FIG. 13B) may be recessed to form gate electrode material layers 1250. The first recess spaces R1 may be formed by selectively etching the conductive material layers (1200 of FIG. 13B) by applying an isotropic etching method using etch selectivity between the insulating material layer 1100, the conductive material layer (1200 of FIG. 13B), and the substrate 1010.

Figure 15A:
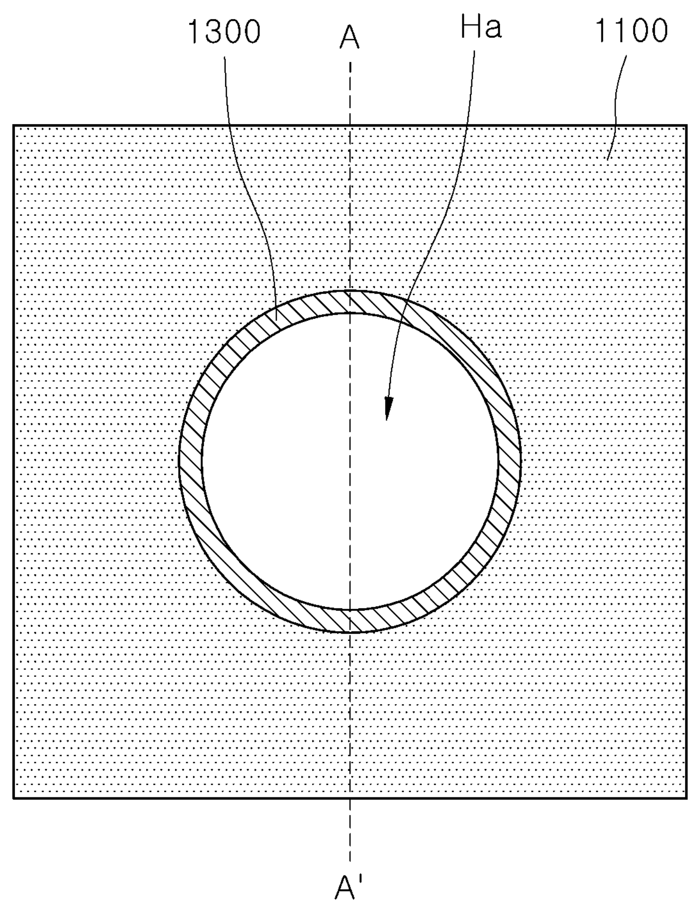
Figure 15A:
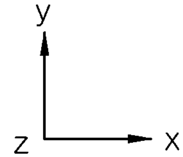
Figure 15B:
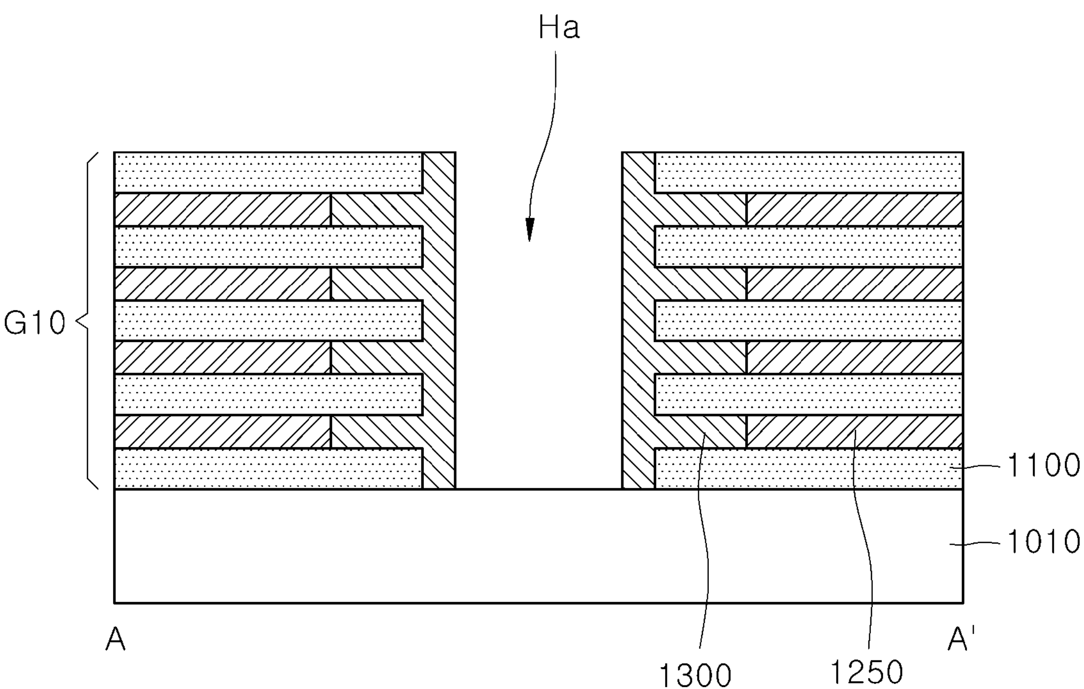
Figure 15B:
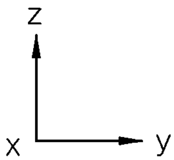

Referring to FIGS. 15A and 15B, at least the first recess spaces R1 may be filled with a ferroelectric material to form a ferroelectric material layer 1300. In an embodiment, the ferroelectric material layer 1300 may be formed to fill the first recess spaces R1, and may also be formed inside the first hole Ha positioned outside the first recess spaces R1. In an embodiment, the ferroelectric material layer 1300 may be formed using a chemical vapor deposition method, an atomic layer deposition method, and the like.

In an embodiment, the ferroelectric material layer 1300 may include metal oxide having a crystal structure of orthorhombic system. The metal oxide may include, for example, hafnium oxide, zirconium oxide, hafnium zirconium oxide, or a combination of two or more thereof. In an embodiment, a dopant may be implanted into the ferroelectric material layer 1300. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination thereof. As an example, the dopant may help the ferroelectric material to maintain the crystal structure of an orthorhombic system, thereby stabilizing the ferroelectric characteristics of the ferroelectric material. As another embodiment, the ferroelectric material layer 1300 may include metal oxide having a perovskite structure. The metal oxide may include, for example, barium titanium oxide ($BaTiO_3$), lead titanium oxide ($PbTiO_3$), barium strontium titanium oxide ($(Ba,Sr)TiO_3$, BST), lithium niobium oxide ($LiNbO_3$), and the like.

Figure 16A:
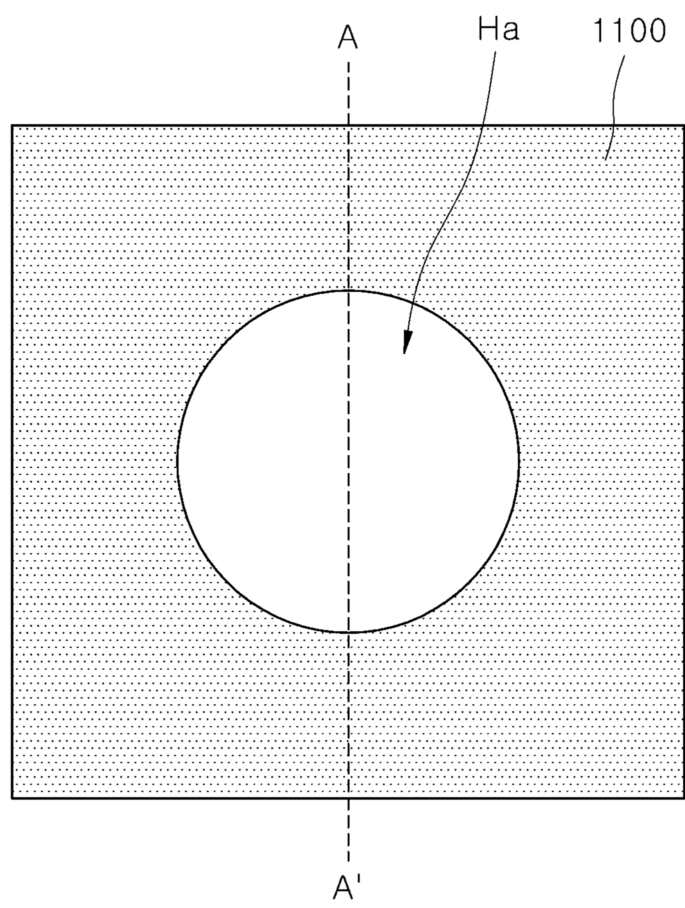
Figure 16A:
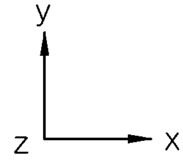
Figure 16B:
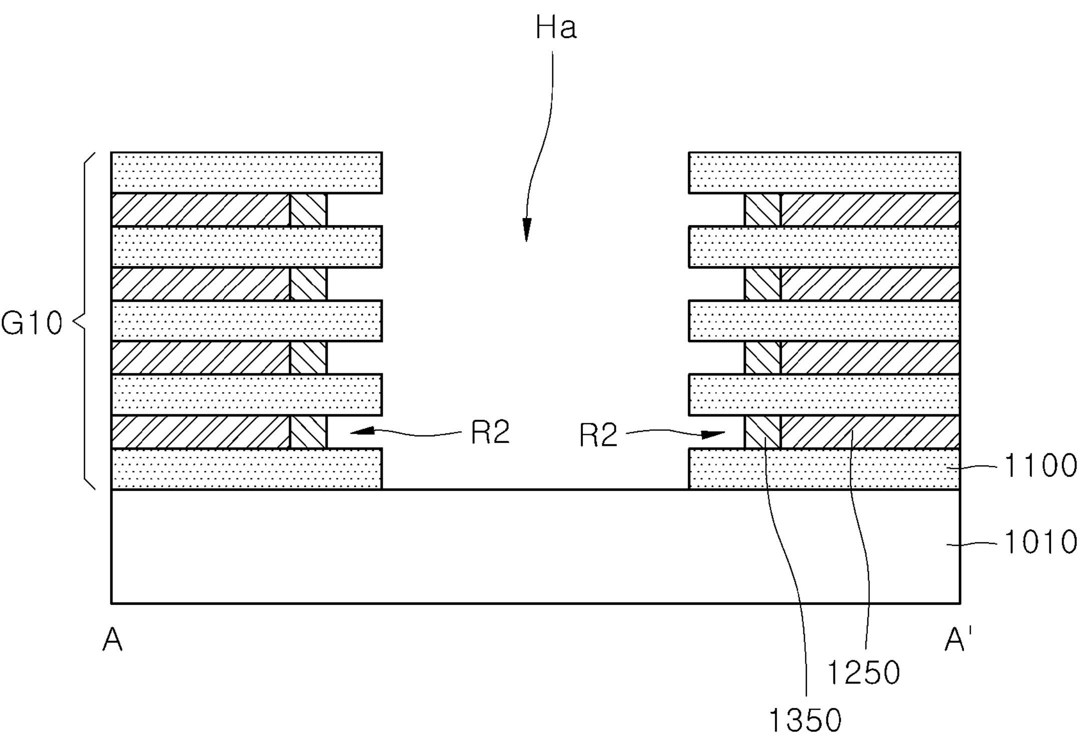
Figure 16B:
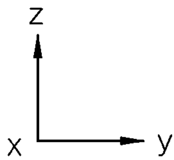

Referring to FIGS. 16A and 16B, the ferroelectric material layer (1300 of FIG. 15B) formed inside the first hole Ha may be selectively removed. In addition, the ferroelectric material layer (1300 of FIG. 15B) filling the first recess spaces R1 may be further etched to form second recess spaces R2. In the process of forming the second recess spaces R2, the ferroelectric material layer (1300 of FIG. 15B) may be recessed to form ferroelectric gate dielectric layers 1350. The second recess spaces R2 may be formed by selectively etching the ferroelectric material layer (1300 of FIG. 15B) by applying an isotropic etching method using etch selectivity of the insulating material layer 1100, the ferroelectric material layer (1300 of FIG. 15B), and the substrate 1010.

Figure 17A:
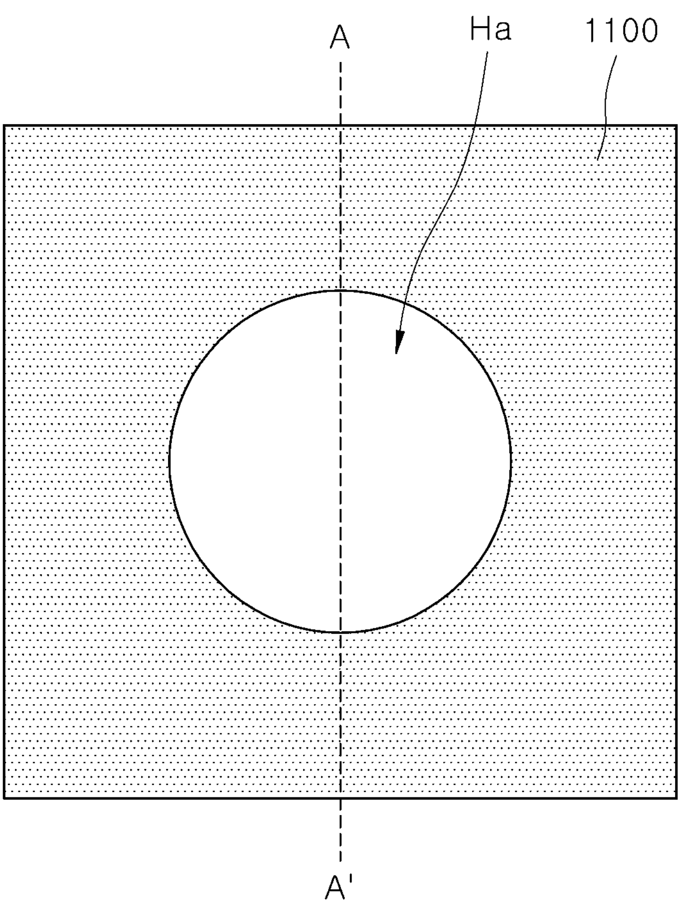
Figure 17A:
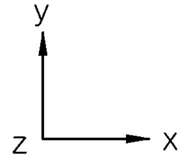
Figure 17B:
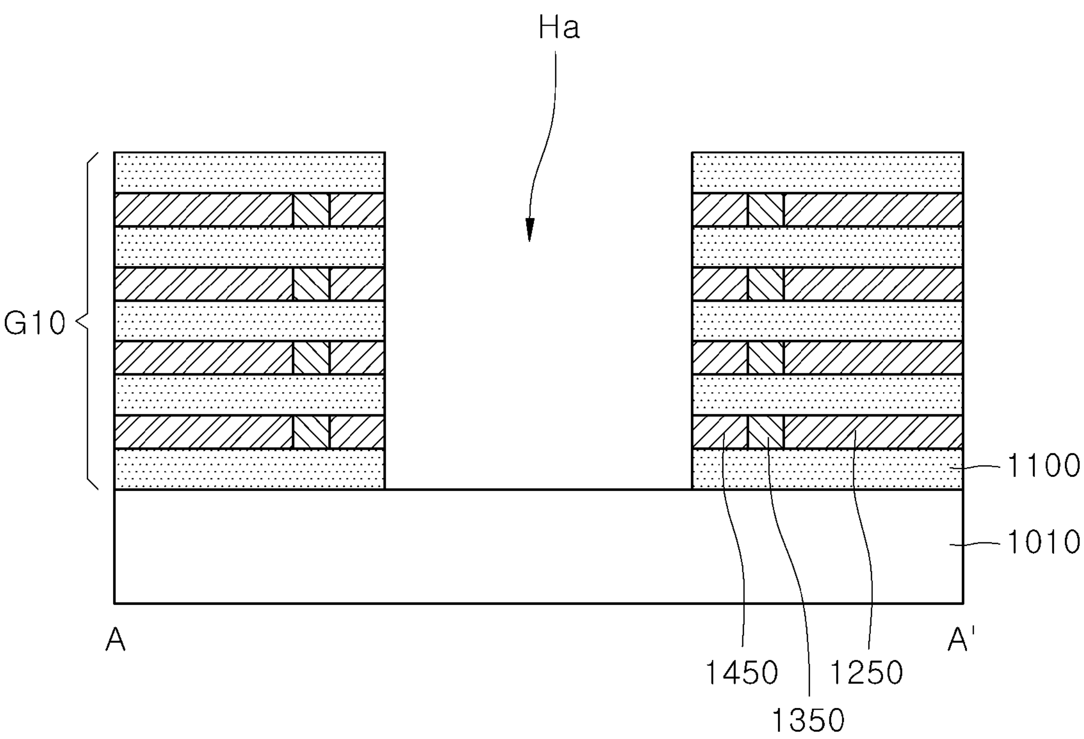
Figure 17B:
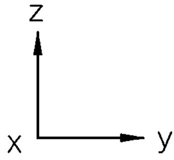

Referring to FIGS. 17A and 17B, the second recess spaces (R2 of FIG. 16B) may be filled with a semiconductor material to form channel material layers 1450. Each of the channel material layers 1450 may include a semiconductor material. The semiconductor material may include, for example, silicon (Si), germanium (Ge), gallium arsenide (GaAs), and the like. The semiconductor material may include, for another example, a two-dimensional semiconductor material. The two-dimensional semiconductor material may include transition metal dichalcogenide (TMDC), black phosphorus, and the like. The transition metal dichalcogenide (TMDC) may include, for example, molybdenum selenide ($MoSe_2$), hafnium selenide ($HfSe_2$), indium selenide (InSe), gallium selenide (GaSe), and the like. The semiconductor material may include, for example, metal oxide such as indium-gallium-zinc oxide (IGZO). In an embodiment, the semiconductor material may be doped with an n-type or p-type dopant, so that the channel material layers 1450 may have electrical conductivity. The channel material layers 1450 may be formed by, for example, a chemical vapor deposition method, an atomic layer deposition method, and the like.

Figure 18A:
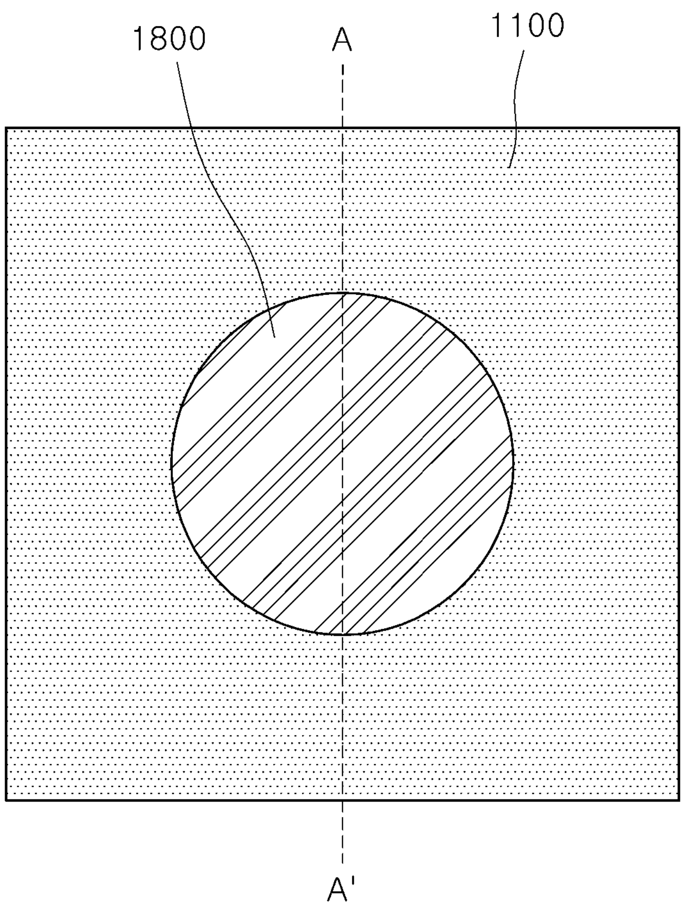
Figure 18A:
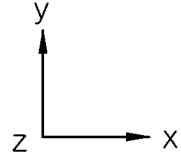
Figure 18B:
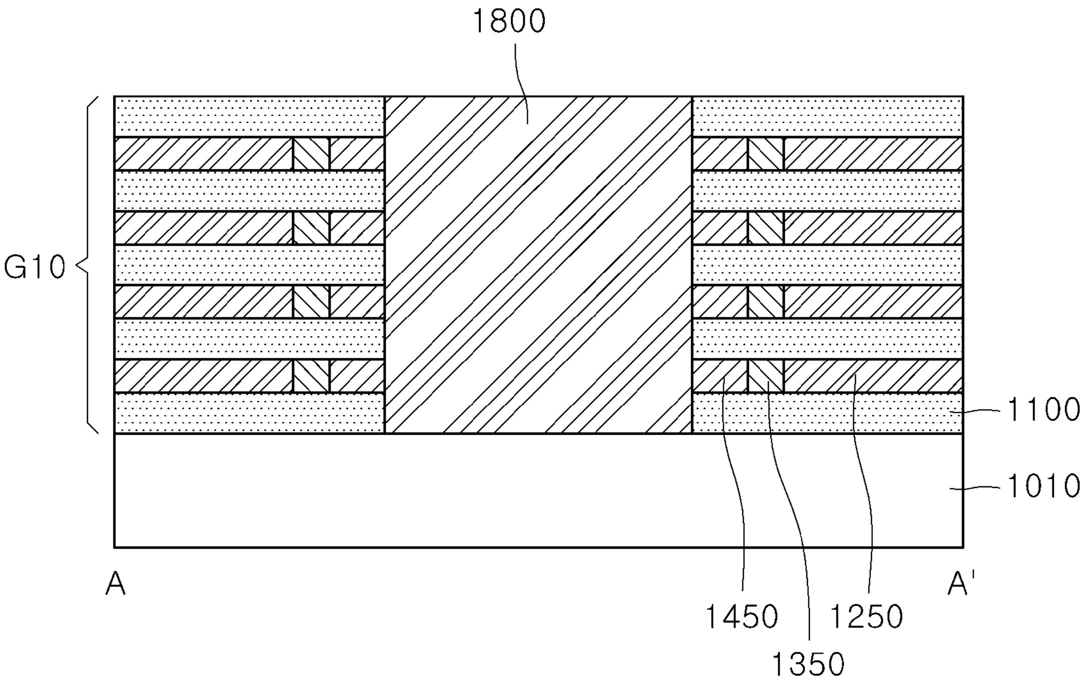
Figure 18B:
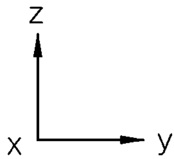

Referring to FIGS. 18A and 18B, the first hole (Ha of FIG. 17A) may be filled with an insulating material to form a hole filling structure 1800. The hole filling structure 1800 may include, for example, oxide, nitride, oxynitride, or a combination thereof. The hole filling structure 1800 may be formed, for example, by a chemical vapor deposition method, a sputtering method, or a coating method.

Figure 19A:
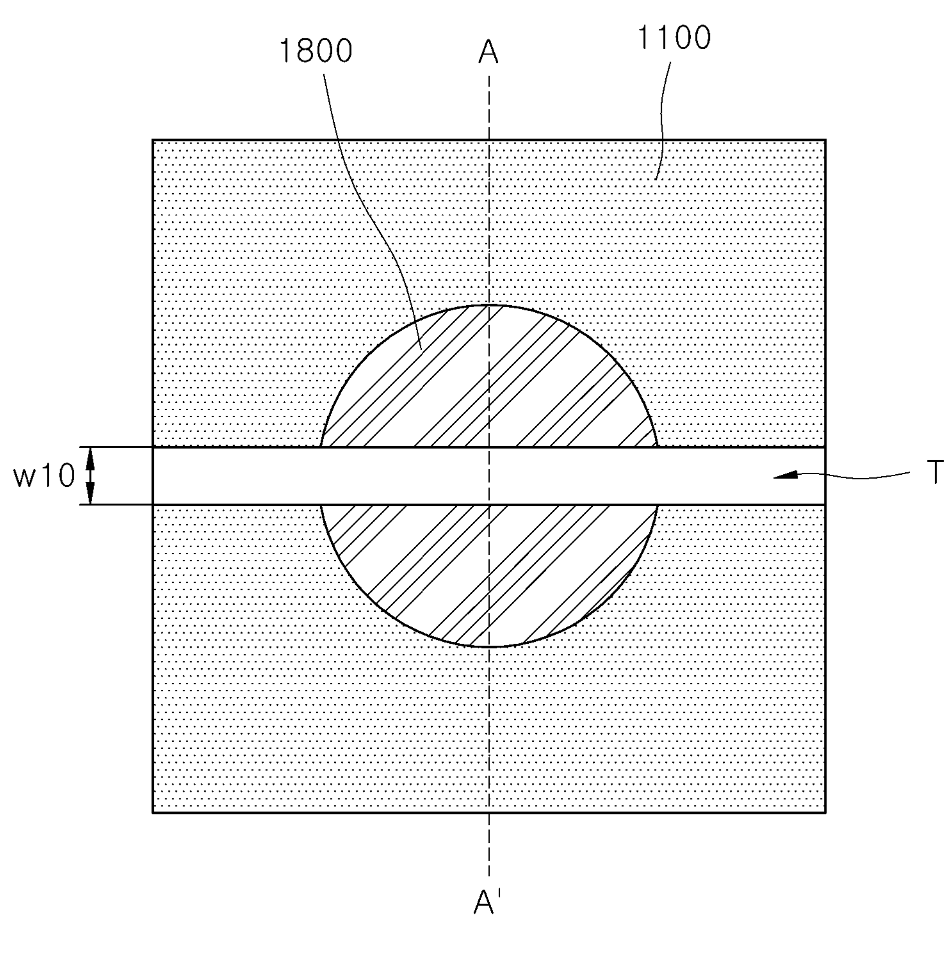
Figure 19A:
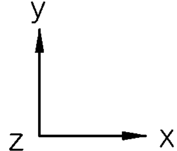
Figure 19B:
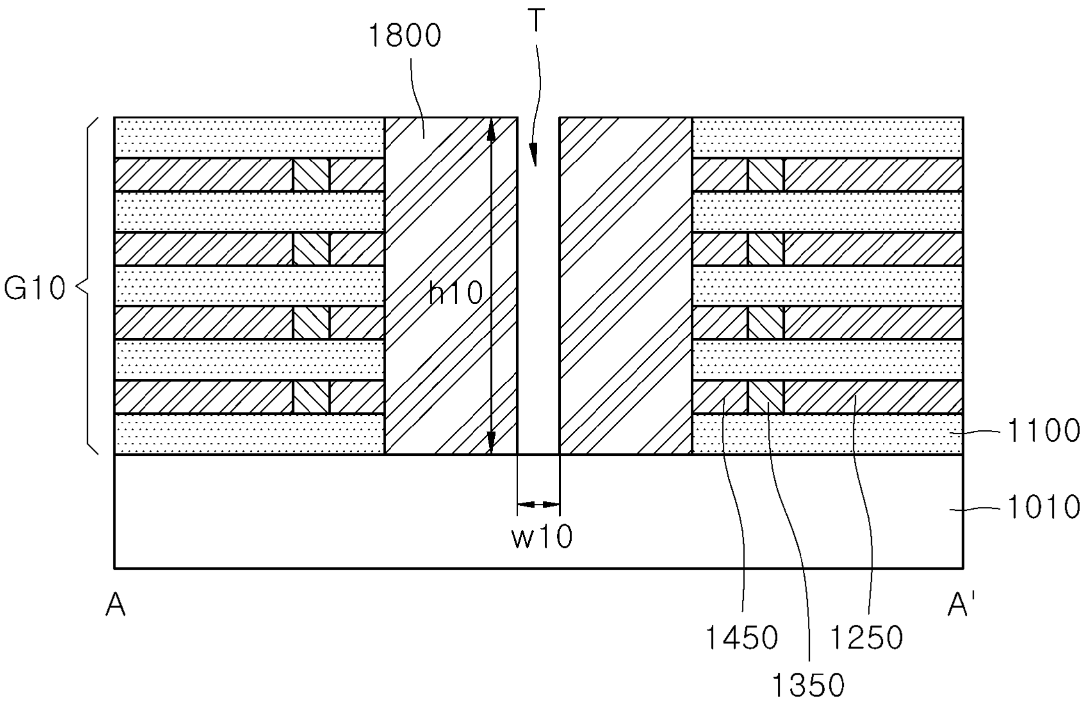
Figure 19B:
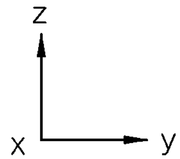

Referring to FIGS. 19A and 19B, a trench pattern T may be formed to penetrate the gate stack structure G10 and the hole filling structure 1800 and to extend in one direction (e.g., the x-direction) on the substrate 1010. The trench pattern T may have a predetermined width w10 in another direction (e.g., the y-direction) perpendicular to the one direction and may have a predetermined height h10 in a height direction (i.e., the z-direction) of the gate stack structure G10. The gate stack structure G10 may be divided into two separate structures by the trench pattern T.

Figure 20A:
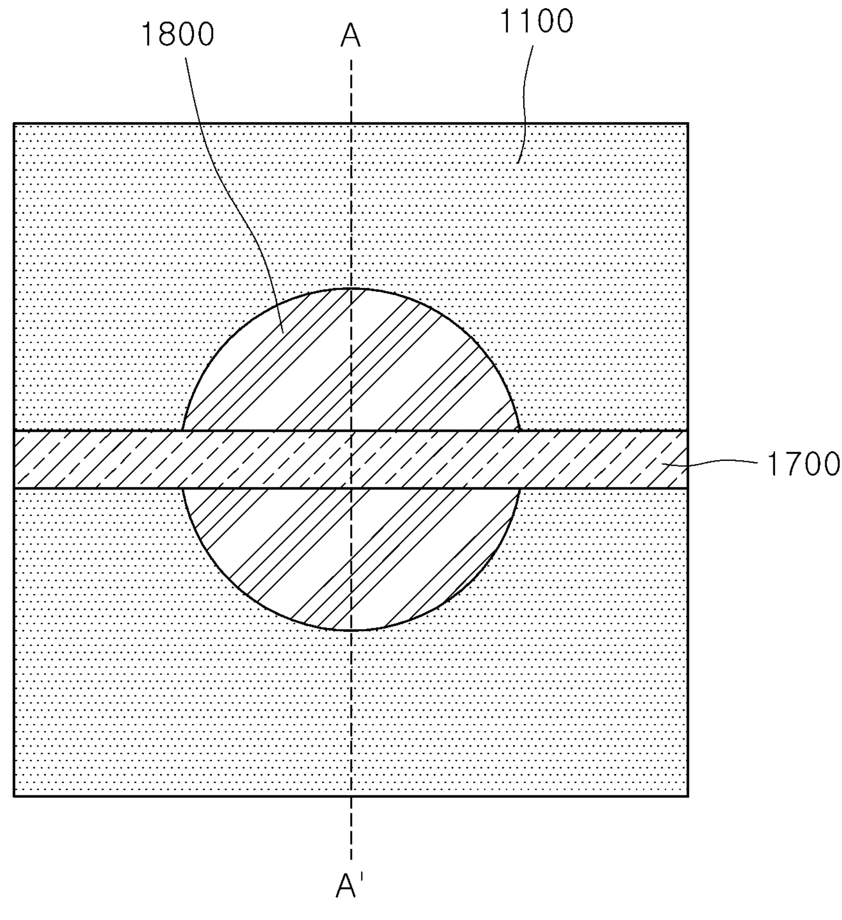
Figure 20A:
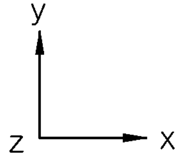
Figure 20B:
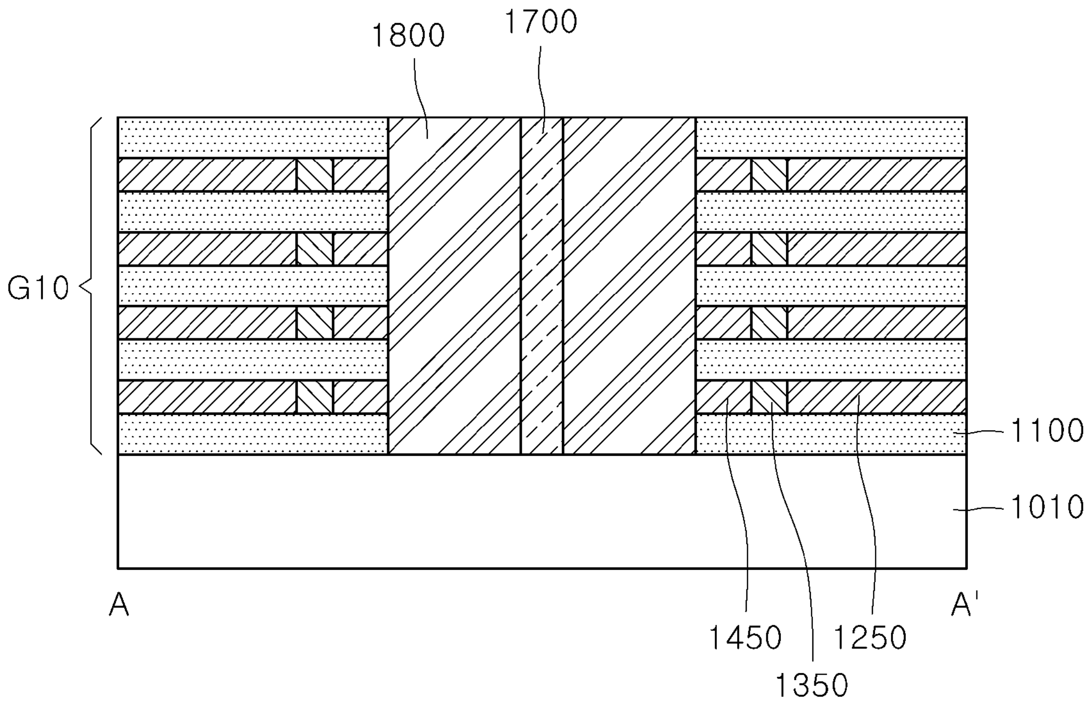
Figure 20B:
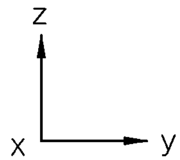

Referring to FIGS. 20A and 20B, the trench pattern (T of FIGS. 19A and 19B) may be filled with an insulating material to form a device isolation structure 1700. The device isolation structure 1700 may include, for example, oxide, nitride, oxynitride, or a combination of two or more thereof. The device isolation structure 1700 may be a wall structure that has the predetermined width w10 and the predetermined height h10 (e.g., T in FIG. 19B) and extends in the x-direction.

Figure 21A:
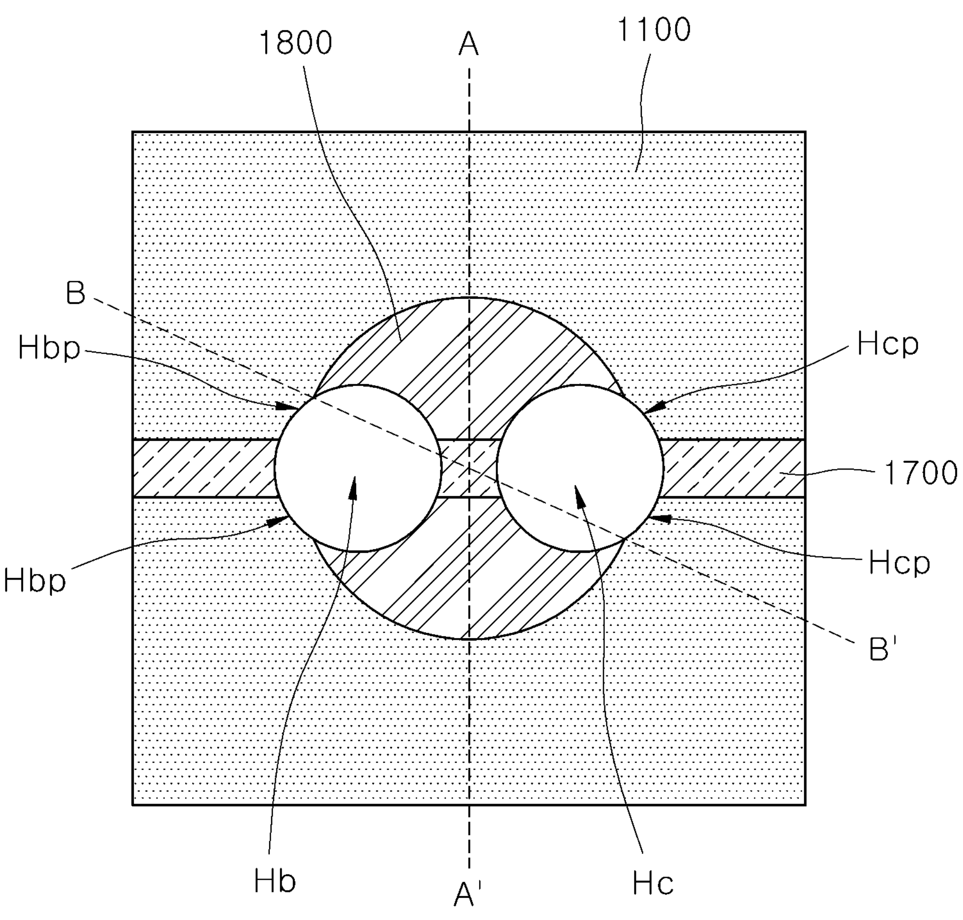
Figure 21A:
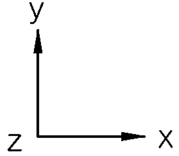
Figure 21B:
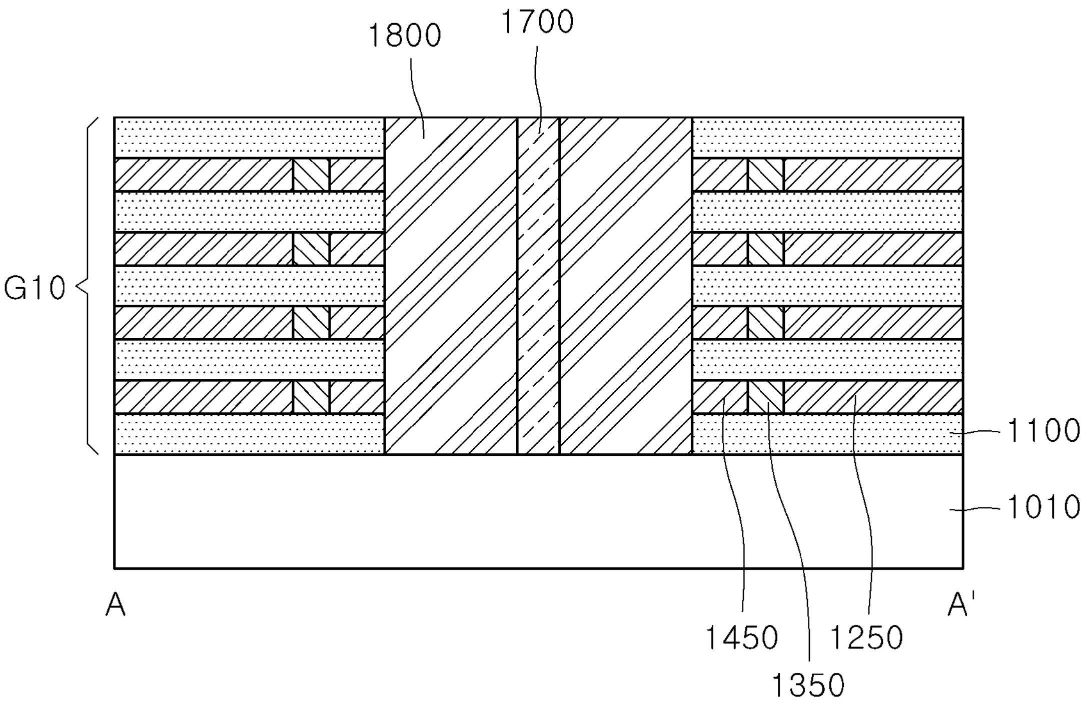
Figure 21B:
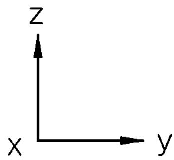
Figure 21C:
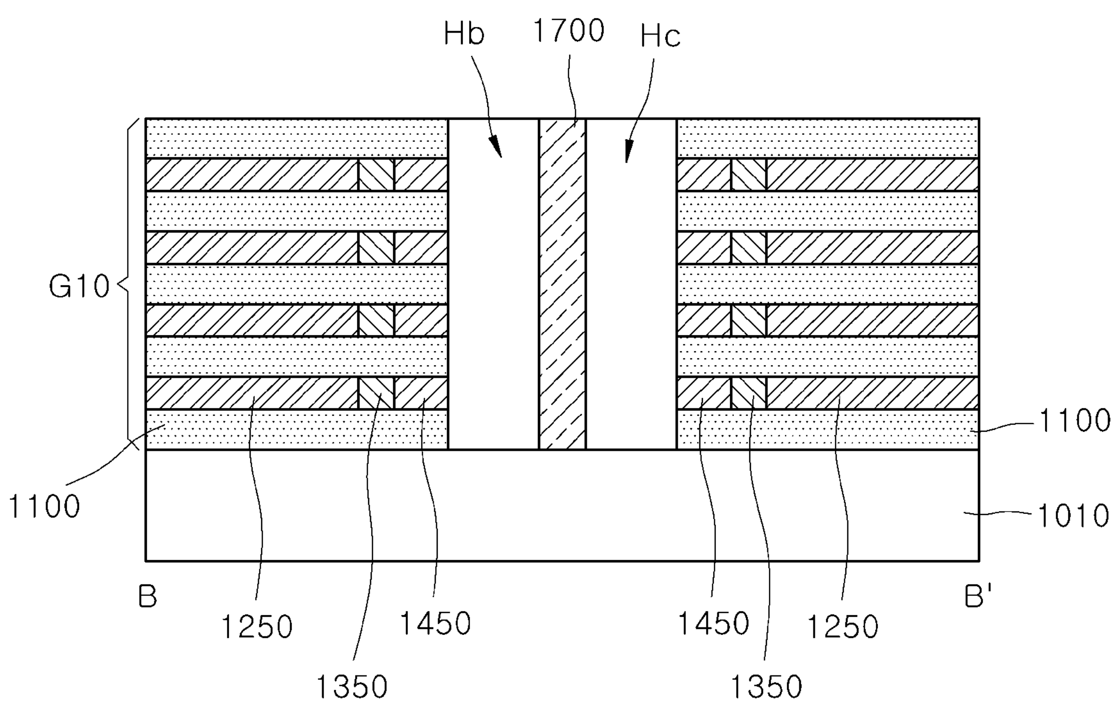

Referring to FIGS. 21A, 21B and 21C, a second hole pattern Hb and a third hole pattern Hc may be formed to be spaced apart from each other in the x-direction. In an embodiment, the second hole pattern Hb and the third hole pattern Hc may be formed by selectively etching the device isolation structure 1700, the hole filling structure 1800, and the gate stack structure G10 using an anisotropic etching method.

Each of the second and third hole patterns Hb and Hc may form a cylindrical space as shown in FIG. 21A, but embodiments are not limited thereto, and space in the form of an elliptical pillar or a polygonal pillar may be formed in other embodiments. A bottom surface of each of the second and third hole patterns Hb and Hc may expose the substrate 1010, and a sidewall surface of each of the second and third hole patterns Hb and Hc may expose the insulating material layers 1100 and channel material layers 1450 of the gate stack structure G10, the device isolation structure 1700, and the hole filling structure 1800. In order for the sidewall surface of each of the second and third hole patterns Hb and Hc to expose the insulating material layers 1100 and channel material layers 1450 of the gate stack structure G10, each of the second and third hole patterns Hb and Hc may include protruding portions Hbp and Hcp protruding into the gate stack structure G10. Each of the second and third hole patterns Hb and Hc may be translated or offset in the x-direction such that a portion of the outer circumference extends past the outer circumference of the hole filling structure 1800.

Figure 22A:
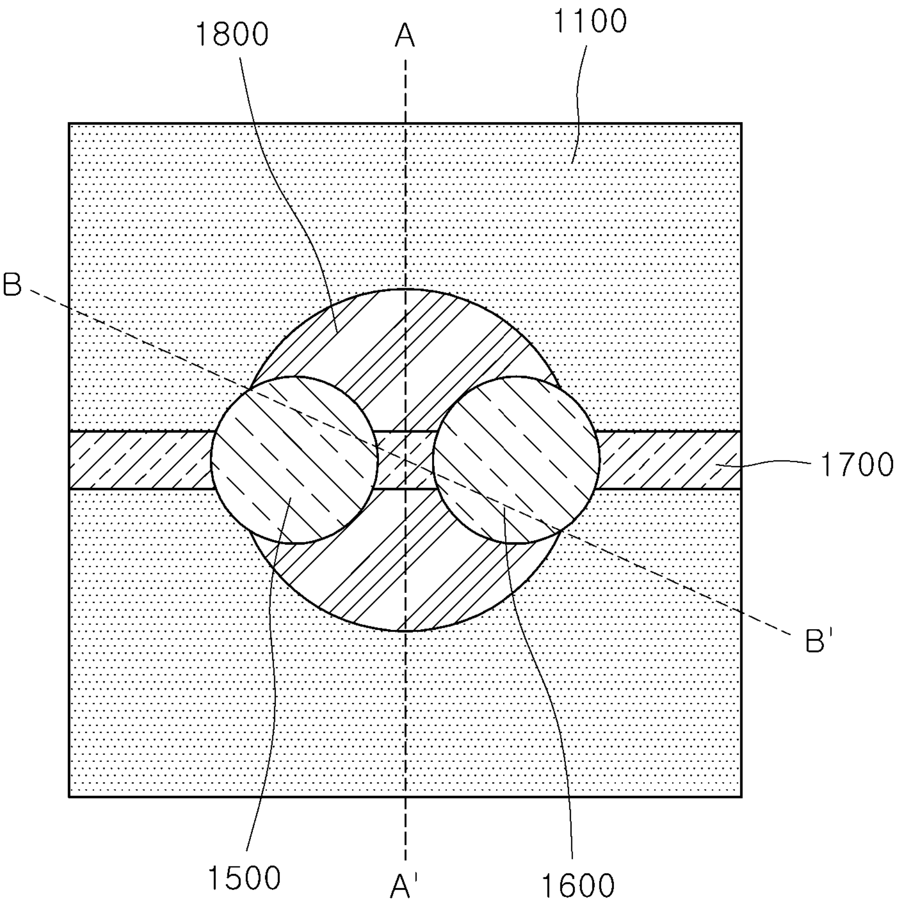
Figure 22B:
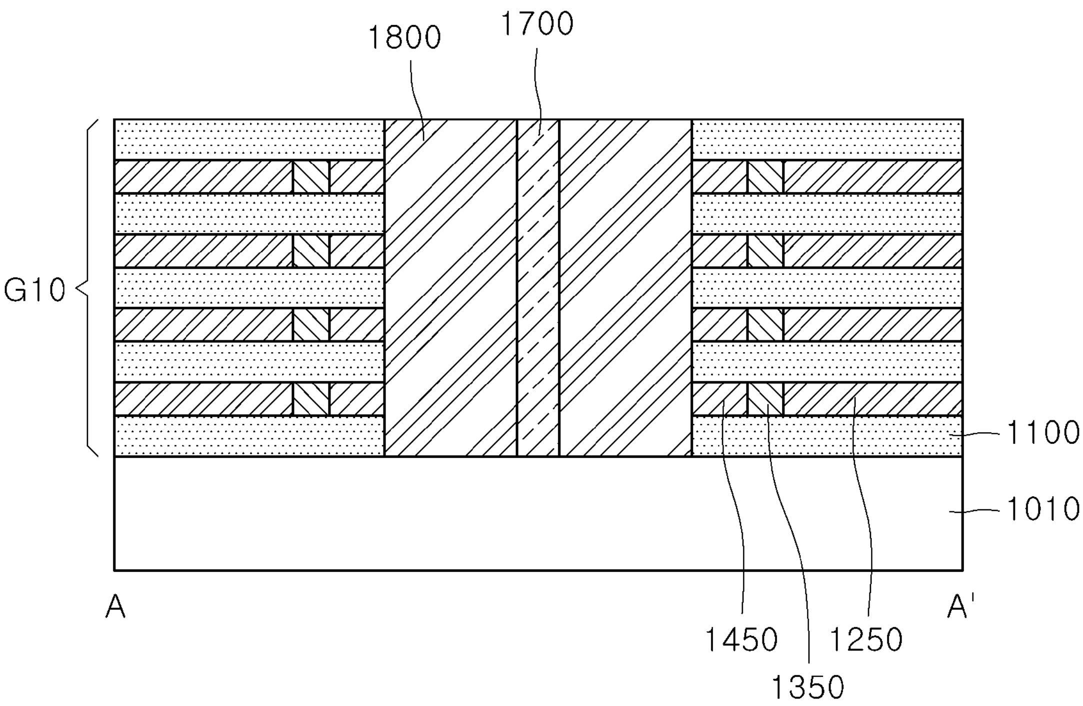
Figure 22B:
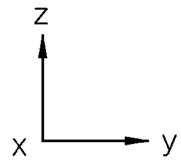
Figure 22C:
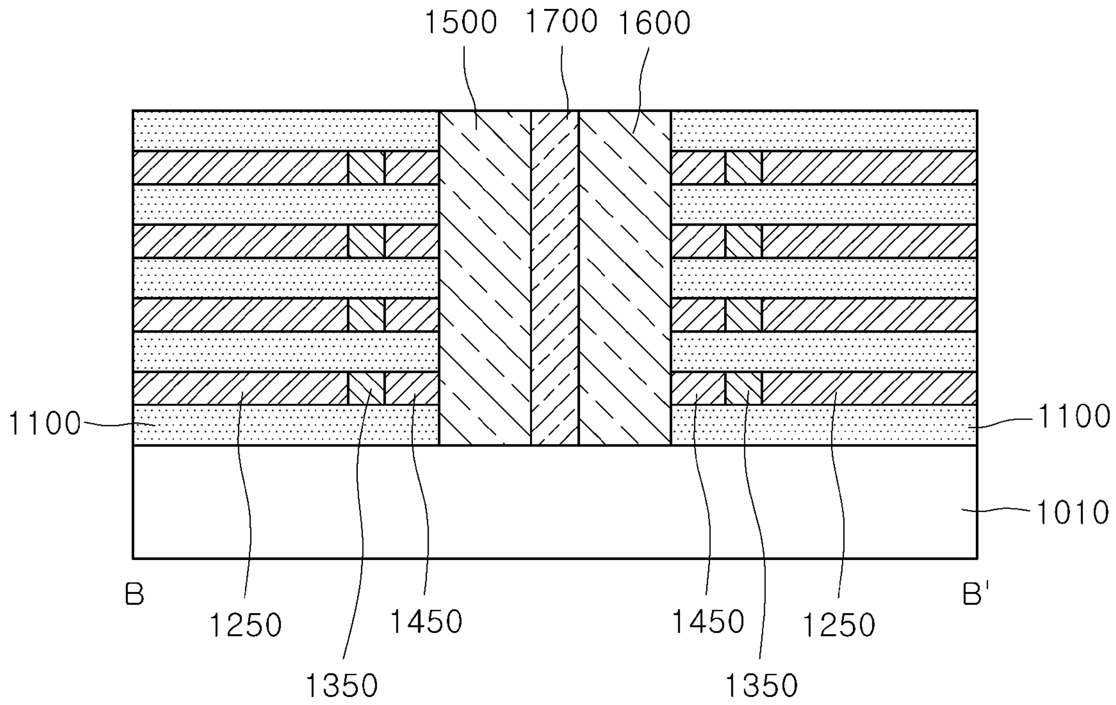

Referring to FIGS. 22A, 22B, and 22C, the second and third hole patterns (Hb and Hc of FIG. 21A) may be filled with a conductive material to form first and second conductive pillars 1500 and 1600. The conductive material may include, for example, a doped semiconductor material, metal, conductive metal nitride, conductive metal carbide, conductive metal silicide, or conductive metal oxide. The first and second conductive pillars 1500 and 1600 may be formed using, for example, a chemical vapor deposition method, a sputtering method, an atomic layer deposition method, and the like. Through the above processes, a ferroelectric memory device according to an embodiment of the present disclosure may be manufactured.

In some other embodiments, interfacial dielectric layers that correspond to the interfacial dielectric layers 132*a* and 132*b* of FIGS. 11A and 11B are additionally formed between the channel material layers 1450 and the ferroelectric gate dielectric layers 1350. Before forming the channel material layers 1450 described above with reference to FIGS. 17A and 17B, the interfacial dielectric layers in contact with the ferroelectric gate dielectric layers 1350 may be additionally formed in the second recess spaces (R2 of FIG. 16B). The interfacial dielectric layers may include, for example, oxide, nitride, oxynitride, or a combination of two or more thereof. The interfacial dielectric layers may be formed, for example, using a chemical vapor deposition method, an atomic layer deposition method, and the like. Next, after forming the interfacial dielectric layers, the second recess spaces (R2 of the FIG. 16B) may be filled with the channel material layers 1450. Subsequently, the processes of FIGS. 18A to 22A and 18B to 22B may be performed. As a result, the ferroelectric memory device UC' described above with reference to FIGS. 11A and 11B may be manufactured. In some other embodiments, floating electrode layers that correspond to floating electrode layers 134*a* and 134*b* of FIGS. 12A and 12B are additionally formed between the interfacial dielectric layers and the ferroelectric gate dielectric layers 1350. Before forming the channel material layers 1450 described above with reference to FIGS. 17A and 17B, the floating electrode layers in contact with the ferroelectric gate dielectric layer 1350, and the interfacial dielectric layers in contact with the floating electrode layers may be sequentially formed in the second recess spaces (R2 of FIG. 16B). The floating electrode layers may include, for example, metal. The floating electrode layers may be formed, for example, using a chemical vapor deposition method, an atomic layer deposition method, and the like. After forming the interfacial dielectric layers, the second recess spaces R2 may be filled with the channel material layers 1450. Subsequently, the processes of FIGS. 18A to 22A and 18B to 22B may be performed. As a result, the ferroelectric memory device UC" described above with reference to FIGS. 12A and 12B may be manufactured.

As described above, although the ferroelectric memory devices including TCAM cells have been disclosed in various embodiments of the present disclosure, the disclosed technical idea is not necessarily limited to the ferroelectric memory devices including TCAM cells. Various embodiments of the present disclosure may be applied to various ferroelectric semiconductor devices including a pair of adjacent ferroelectric field effect transistors. Each of the pair of ferroelectric field effect transistors may constitute a separate memory cell.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A ferroelectric memory device comprising:

a substrate;

a gate structure disposed over the substrate and including a plurality of gate electrode layers spaced apart from each other along a first direction substantially perpendicular to a surface of the substrate;

a first electrode pillar and a second electrode pillar that extend along the first direction and are disposed to be spaced apart from each other in a second direction substantially parallel to the surface of the substrate inside a hole penetrating the gate structure; and a device isolation structure disposed over the substrate, wherein the gate structure further includes a plurality of ferroelectric layers and a plurality of channel layers that are disposed to correspond to the plurality of gate electrode layers, and wherein the device isolation structure extending across the hole and dividing the gate structure into a first gate part and a second gate part that are electrically insulated from each other.

2. The ferroelectric memory device of claim 1, wherein each of the first and second electrode pillars is electrically connected to the plurality of channel layers.

3. The ferroelectric memory device of claim 1, wherein a portion of an outer circumferential surface of the first electrode pillar and a portion of an outer circumferential surface of the second electrode pillar are disposed to contact each of the plurality of channel layers.

4. The ferroelectric memory device of claim 1, wherein among the plurality of gate electrode layers, the plurality of ferroelectric layers, and the plurality of channel layers, one gate electrode layer, one ferroelectric layer, and one channel layer corresponding to each other are sequentially disposed on a plane parallel to the surface of the substrate.

5. The ferroelectric memory device of claim 1, wherein the plurality of channel layers are disposed along a circumference of the hole, wherein each of the plurality of ferroelectric layers is disposed to surround each of the plurality of channel layers, and wherein each of the plurality of gate electrode layers is disposed to surround each of the plurality of ferroelectric layers.

6. The ferroelectric memory device of claim 5, further comprising a plurality of interfacial dielectric layers, each of the plurality of interfacial dielectric layers being disposed respectively between each of the plurality of ferroelectric layers and each of the plurality of channel layers.

7. The ferroelectric memory device of claim 6, further comprising a plurality of floating electrode layers, each of the plurality of floating electrode layers being disposed respectively between each of the plurality of ferroelectric layers and each of the plurality of interfacial dielectric layers.

8. The ferroelectric memory device of claim 1, wherein the gate structure further includes interlayer insulation layers disposed between the plurality of gate electrode layers, the plurality of ferroelectric layers, and the plurality of channel layers along the first direction.

9. The ferroelectric memory device of claim 1, wherein the gate structure includes the first gate part and the second gate part that are separated by the device isolation structure, and wherein the plurality of gate electrode layers of the first gate part are electrically insulated from the plurality of gate electrode layers of the second gate part.

10. The ferroelectric memory device of claim 9, wherein the plurality of channel layers of the first gate part and the plurality of channel layers of the second gate part electrically share the first and second electrode pillars.

11. The ferroelectric memory device of claim 1, wherein the device isolation structure is disposed to extend in the second direction substantially parallel to the surface of the substrate.

12. The ferroelectric memory device of claim 1, further comprising a hole filling material layer that fills the hole over the substrate.

13. A ferroelectric memory device comprising:

a substrate;

a gate structure disposed over the substrate and including a plurality of gate electrode layers spaced apart from each other along a first direction substantially perpendicular to a surface of the substrate;

a plurality of holes penetrating the gate structure over the substrate, the plurality of holes arranged along a second direction substantially parallel to the surface of the substrate;

first and second electrode pillars disposed to extend along the first direction inside the plurality of holes; and a device isolation structure disposed over the substrate, the device isolation structure extending across the plurality of holes and dividing the gate structure into a first gate part and a second gate part that are electrically insulated from each other, wherein the gate structure further includes a plurality of ferroelectric layers and a plurality of channel layers, which are disposed to correspond to the plurality of gate electrode layers, and wherein the first and second electrode pillars are disposed to be electrically connected to the plurality of channel layers.

14. The ferroelectric memory device of claim 13, wherein a portion of an outer circumferential surface of the first electrode pillar and a portion of an outer circumferential surface of the second electrode pillar are disposed to contact each of the plurality of channel layers.

15. The ferroelectric memory device of claim 13, wherein among the plurality of gate electrode layers, the plurality of ferroelectric layers, and the plurality of channel layers, one gate electrode layer, one ferroelectric layer, and one channel layer corresponding to each other are sequentially disposed on a plane parallel to the surface of the substrate.

16. The ferroelectric memory device of claim 13, wherein each of the plurality of channel layers is disposed along a circumference of each of the plurality of holes, wherein each of the plurality of ferroelectric layers is disposed to surround each of the plurality of channel layers, and wherein each of the plurality of gate electrode layers is disposed to surround each of the plurality of ferroelectric layers.

17. The ferroelectric memory device of claim 13, wherein the gate structure includes the first gate part and the second gate part that are separated by the device isolation structure, and wherein the plurality of gate electrode layers of the first gate part are electrically insulated from the plurality of gate electrode layers of the second gate part.

18. The ferroelectric memory device of claim 17, wherein the first and second gate parts electrically share the first and second electrode pillars.

19. The ferroelectric memory device of claim 13, wherein the device isolation structure is disposed inside the plurality of holes to cross the first and second electrode pillars.

20. The ferroelectric memory device of claim 13, further comprising a gate isolation structure disposed between the plurality of holes and extending in the second direction.

* * * * *